United States Patent
Yamaguchi

(10) Patent No.: US 9,064,762 B2
(45) Date of Patent: Jun. 23, 2015

(54) SOLID-STATE IMAGING DEVICE, METHOD FOR MANUFACTURING SOLID-STATE IMAGING DEVICE, AND IMAGING APPARATUS

(75) Inventor: Tetsuji Yamaguchi, Kanagawa (JP)

(73) Assignee: SONY CORPORATION (JP)

(*) Notice: Subject to any disclaimer, the term of this patent is extended or adjusted under 35 U.S.C. 154(b) by 644 days.

(21) Appl. No.: 12/622,652

(22) Filed: Nov. 20, 2009

(65) Prior Publication Data

US 2010/0128161 A1 May 27, 2010

(30) Foreign Application Priority Data

Nov. 21, 2008 (JP) .................................. 2008-297719

(51) Int. Cl.
*H01L 27/146* (2006.01)

(52) U.S. Cl.
CPC ..... *H01L 27/14603* (2013.01); *H01L 27/14609* (2013.01); *H01L 27/1463* (2013.01); *H01L 27/14687* (2013.01)

(58) Field of Classification Search
CPC ..................... H01L 27/14603; H01L 27/1463; H01L 27/14687; H01L 27/14609
USPC .......... 348/241, 272, 294, 302, 311; 257/291, 257/292
See application file for complete search history.

(56) References Cited

U.S. PATENT DOCUMENTS

| | | | | |
|---|---|---|---|---|
| 7,619,266 B2* | 11/2009 | Mouli | .......................... | 257/291 |
| 7,692,715 B2* | 4/2010 | Kitajima | ....................... | 348/362 |
| 7,858,508 B2* | 12/2010 | Fujimoto et al. | .............. | 438/589 |
| 2006/0286766 A1* | 12/2006 | Cole et al. | ..................... | 438/424 |
| 2007/0096176 A1* | 5/2007 | Mouli | .......................... | 257/291 |

FOREIGN PATENT DOCUMENTS

| | | |
|---|---|---|
| JP | 2006-024786 | 1/2006 |
| JP | 2006-093319 | 4/2006 |
| JP | 2006-120804 | 5/2006 |
| JP | 2007-142298 | 6/2007 |
| WO | WO 2007/081881 | 7/2007 |

OTHER PUBLICATIONS

Official Action (no English translation available) for Japanese Patent Application No. 2008-297719 mailed May 28, 2013, 3 pages.

* cited by examiner

*Primary Examiner* — Twyler Haskins
*Assistant Examiner* — Peter Chon
(74) *Attorney, Agent, or Firm* — Sheridan Ross P.C.

(57) ABSTRACT

A solid-state imaging device includes, on a semiconductor substrate, a pixel portion having a plurality of pixels provided with a photoelectric conversion portion, which photoelectrically converts incident light to obtain a signal charge and a pixel transistor portion, which converts the signal charge read from the photoelectric conversion portion to a voltage, wherein an element isolation region disposed in the pixel portion includes an insulating film buried in a trench disposed in the semiconductor substrate, and the insulating film includes an insulating film having a negative charge.

20 Claims, 14 Drawing Sheets

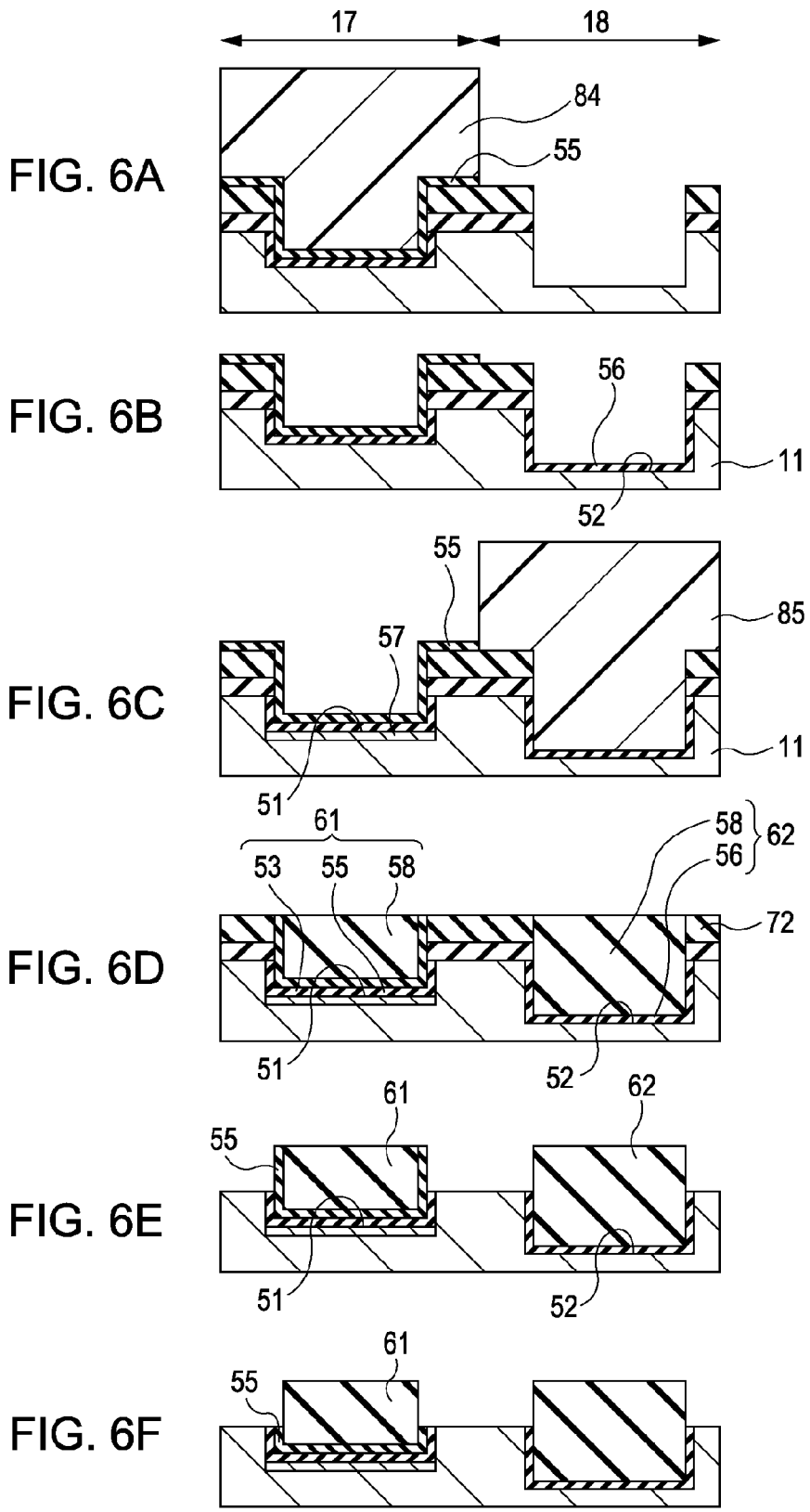

SOLID-STATE IMAGING DEVICE, METHOD FOR MANUFACTURING SOLID-STATE IMAGING DEVICE, AND IMAGING APPARATUS

BACKGROUND OF THE INVENTION

1. Field of the Invention

The present invention relates to a solid-state imaging device, a method for manufacturing the solid-state imaging device, and an imaging apparatus.

2. Description of the Related Art

In general, shallow trench isolation (STI) is used for element isolation in a finer semiconductor integrated circuit in recent years. However, since STI is provided by digging deeply a trench in a semiconductor substrate, a crystal defect or an interface state occurs at an interface between an insulating film buried in the trench serving for element isolation and the semiconductor substrate so as to become a noise source. Therefore, regarding a CMOS image sensor, in the case where the STI is adopted as a method for element isolation of a pixel portion in parallel with a peripheral circuit, deterioration of a characteristic occurs in such a way that noises are generated at the interface between the semiconductor substrate dug and the insulating film buried. Consequently, a method, in which the amount of digging of the semiconductor substrate in an element isolation region of the pixel region is reduced so as to suppress generation of noises from an element isolation end, has been proposed as a technique for reducing deterioration of a solid-state imaging element due to noise (refer to, for example, Japanese Unexamined Patent Application Publication No. 2006-24786 and Japanese Unexamined Patent Application Publication No. 2006-93319).

However, even in the case where the above-described element isolation method is applied, in which the amount of digging for the element isolation of the pixel portion is reduced, as shown in FIG. 13 and FIG. 14, it is necessary that a hole accumulation layer 113 is formed under an element isolation region 112 of a pixel portion 111 by introducing a P-type impurity. FIG. 13 described above shows a plane layout of the pixel portion, and FIG. 14 is a sectional view showing the section of a pixel portion, taken along a line XIV-XIV shown in FIG. 13.

As a result, an effect of diffusion of the impurity of the hole accumulation layer 113 becomes significant as the pixel becomes finer, and effective channel widths of a reset transistor 114R, an amplifying transistor 114A, a selection transistor 114s are reduced because of the effect of diffusion of the P-type impurity. If the effective channel width is reduced as described above, deterioration of 1/f noise of, in particular, the amplifying transistor 114A becomes a problem.

Furthermore, it has become difficult to increase the channel width because the pixel has been made finer.

Consequently, it has become difficult to ensure the compatibility between noise reduction and a finer pixel.

Moreover, a method has been proposed, in which a conductor for voltage application is buried in the STI in order to bring the interface between an insulating film for element isolation and a semiconductor substrate into a hole accumulation state, for the purpose of suppressing generation of noises in an element isolation region of an STI structure (refer to, for example, Japanese Unexamined Patent Application Publication No. 2006-120804).

In the method in which the conductor for voltage application is buried into the above-described SDI, it is necessary that a conductor for applying a negative voltage is buried in the element isolation region. At that time, it is necessary that the conductor is buried into the element isolation region around, in particular, the selection transistor and the amplifying transistor of the pixel region in such a way as to avoid becoming electrically continuous with polysilicon serving as a gate electrode of the transistor. However, it is difficult to bury the conductor throughout the element isolation region of the pixel region of a fine pixel while avoiding polysilicon of the gate electrode. Consequently, regarding the purpose of suppressing deterioration of 1/f noise along with the effect of reducing the channel of the transistor of the pixel, it is difficult to obtain a deterioration suppression effect by burying the conductor.

SUMMARY OF THE INVENTION

The present inventor has recognized that it is difficult to increase a channel width because a pixel has been made finer and if an effective channel width is reduced, the 1/f noise of a pixel transistor portion, in particular an amplifying transistor, deteriorates and, therefore, the compatibility between noise reduction and a finer pixel is difficult.

It is desirable that noise reduction and a finer pixel are mutually compatible.

A solid-state imaging device according to an embodiment of the present invention includes, on a semiconductor substrate, a pixel portion having a plurality of pixels provided with a photoelectric conversion portion, which photoelectrically converts incident light to obtain a signal charge, and a pixel transistor portion, which converts the signal charge read from the above-described photoelectric conversion portion to a voltage, wherein an element isolation region disposed in the above-described pixel portion includes an insulating film buried in a trench disposed in the above-described semiconductor substrate, and the above-described insulating film includes an insulating film having a negative charge.

In the solid-state imaging device according to an embodiment of the present invention, the element isolation region disposed in the pixel portion includes the insulating film having a negative charge. Therefore, a hole accumulation layer resulting from the negative charge in the insulating film having the negative charge is generated in the semiconductor substrate immediately under the element isolation region. Noise generation from defects of the interface between the element isolation region and the semiconductor substrate is suppressed by the hole accumulation layer. Furthermore, since the hole accumulation layer is formed by the negative charge, a P-type impurity region formed in the semiconductor substrate immediately under the element isolation region in the related art may be omitted. Alternatively, in the case where a P-type impurity region is formed, the concentration thereof is reduced. Consequently, reduction of the effective channel width of the transistor in the pixel transistor portion due to diffusion of the P-type impurity of the P-type impurity region is suppressed and, thereby, a sufficient effective channel width may be ensured. Therefore, the 1/f noise of the transistor in the pixel transistor portion is reduced. Put another way, diffusion of the P-type impurity due to the P-type impurity region is suppressed and the pixel size may be reduced correspondingly, while the effective channel width is ensured, and the 1/f noise is reduced.

A method for manufacturing a solid-state imaging device (a first manufacturing method), according to an embodiment of the present invention, includes sequentially the steps of forming a first trench for element isolation in a pixel region of a semiconductor substrate and a second trench for element isolation in a peripheral circuit region, forming an insulating film having a negative charge on inner surfaces of the above-described first trench and the above-described second trench with silicon oxide films therebetween, removing the above-described insulating film which is disposed in the above-described peripheral circuit region and which has a negative charge, making the above-described second trench deeper than the first trench, and burying buried insulating films into the above-described first trench and the above-described second trench so as to form a first element isolation region in the above-described first trench and a second element isolation region in the above-described second trench.

A method for manufacturing a solid-state imaging device (a second manufacturing method), according to an embodiment of the present invention, includes sequentially the steps of forming a first trench for element isolation in a pixel region of a semiconductor substrate and a second trench for element isolation in a peripheral circuit region, making the above-described second trench deeper than the above-described first trench while the above-described first trench is masked, forming an insulating film having a negative charge on inner surfaces of the above-described first trench and the above-described second trench with silicon oxide films therebetween, removing the above-described insulating film which is disposed in the above-described peripheral circuit region and which has a negative charge, and burying buried insulating films into the above-described first trench and the above-described second trench so as to form a first element isolation region in the above-described first trench and a second element isolation region in the above-described second trench.

A method for manufacturing a solid-state imaging device (a third manufacturing method), according to an embodiment of the present invention, includes sequentially the steps of forming a first trench for element isolation in a peripheral circuit region of a substrate including a semiconductor substrate, burying a first buried insulating film into the above-described first trench so as to form a first element isolation region, forming an insulating film covering the above-described first element isolation region on the above-described substrate, forming a second trench for element isolation in a pixel region of the above-described semiconductor substrate provided with the above-described insulating film, forming an insulating film having a negative charge on an inner surface of the above-described second trench with a silicon oxide film therebetween, and burying a second buried insulating film into the above-described second trench so as to form a second element isolation region.

A method for manufacturing a solid-state imaging device (a fourth manufacturing method), according to an embodiment of the present invention, includes sequentially the steps of forming a first trench for element isolation in a pixel region of a semiconductor substrate and a second trench for element isolation in a peripheral circuit region, making the above-described second trench deeper than the above-described first trench while the above-described first trench is masked, forming an insulating film having a negative charge on inner surfaces of the above-described first trench and the above-described second trench with silicon oxide films therebetween, and burying buried insulating films into the above-described first trench and the above-described second trench so as to form a first element isolation region in the above-described first trench and a second element isolation region in the above-described second trench.

In each of the methods for manufacturing a solid-state imaging device, according to an embodiment of the present invention, the insulating film having a negative charge is formed in the element isolation region disposed in the pixel portion. Therefore, a hole accumulation layer resulting from the negative charge in the insulating film having the negative charge is generated in the semiconductor substrate immediately under the element isolation region. Noise generation from defects of the interface between the element isolation region and the semiconductor substrate is suppressed by the hole accumulation layer. Furthermore, since the hole accumulation layer is formed by the negative charge, a P-type impurity region formed in the semiconductor substrate immediately under the element isolation region in the related art may be omitted. Alternatively, in the case where a P-type impurity region is formed, the concentration thereof is reduced. Consequently, reduction of the effective channel width of the transistor in the pixel transistor portion due to diffusion of the P-type impurity of the P-type impurity region is suppressed and, thereby, a sufficient effective channel width may be ensured. Therefore, the 1/f noise of the transistor in the pixel transistor portion is reduced. Put another way, diffusion of the P-type impurity due to the P-type impurity region is suppressed and the pixel size may be reduced correspondingly, while the effective channel width is ensured, and the 1/f noise is reduced.

An imaging apparatus according to an embodiment of the present invention includes an image-focusing optical portion to condense incident light, an imaging portion including a solid-state imaging device to receive and photoelectrically convert the light condensed with the above-described image-focusing optical portion, and a signal processing portion to process the signal subjected to the photoelectrical conversion, wherein the above-described solid-state imaging device includes, on a semiconductor substrate, a pixel portion provided with a photoelectric conversion portion, which photoelectrically converts incident light to obtain a signal charge, and a pixel transistor portion, which converts the signal charge read from the above-described photoelectric conversion portion to a voltage, an element isolation region disposed in the above-described pixel portion includes an insulating film buried in a trench disposed in the above-described semiconductor substrate, and the above-described insulating film includes an insulating film having a negative charge.

In the imaging apparatus according to an embodiment of the present invention, the solid-state imaging device according to an embodiment of the present invention is used. Consequently, reduction of the effective channel width of the transistor in the pixel transistor portion of the solid-state imaging device is suppressed and, thereby, the 1/f noise of the transistor in the pixel transistor portion is reduced.

Regarding the solid-state imaging device according to an embodiment of the present invention, diffusion of the P-type impurity due to the P-type impurity region is suppressed and the pixel size may be reduced correspondingly, while the effective channel width is ensured, and the 1/f noise is reduced. Consequently, noise suppression and a finer pixel are mutually compatible. Therefore, there is an advantage that the image quality of imaging is improved.

Regarding each of the methods for manufacturing a solid-state imaging device, according to an embodiment of the present invention, diffusion of the P-type impurity due to the P-type impurity region is suppressed and the pixel size may be reduced correspondingly, while the effective channel width is ensured, and the 1/f noise is reduced. Consequently, noise suppression and a finer pixel are mutually compatible. Therefore, there is an advantage that the image quality of imaging is improved.

Regarding the imaging apparatus according to an embodiment of the present invention, since the solid-state imaging device, in which noise reduction and a finer pixel are mutually compatible, according to an embodiment of the present inven-

BRIEF DESCRIPTION OF THE DRAWINGS

FIGS. 6A to 6F are sectional views showing production steps of the second example of the method for manufacturing a solid-state imaging device, according to the third embodiment of the present invention;

DESCRIPTION OF THE PREFERRED EMBODIMENTS

The preferred embodiments for executing the present invention (hereafter referred to as embodiments) will be described below.

First Embodiment

One Example of Configuration of Solid-State Imaging Device

Figure 1:
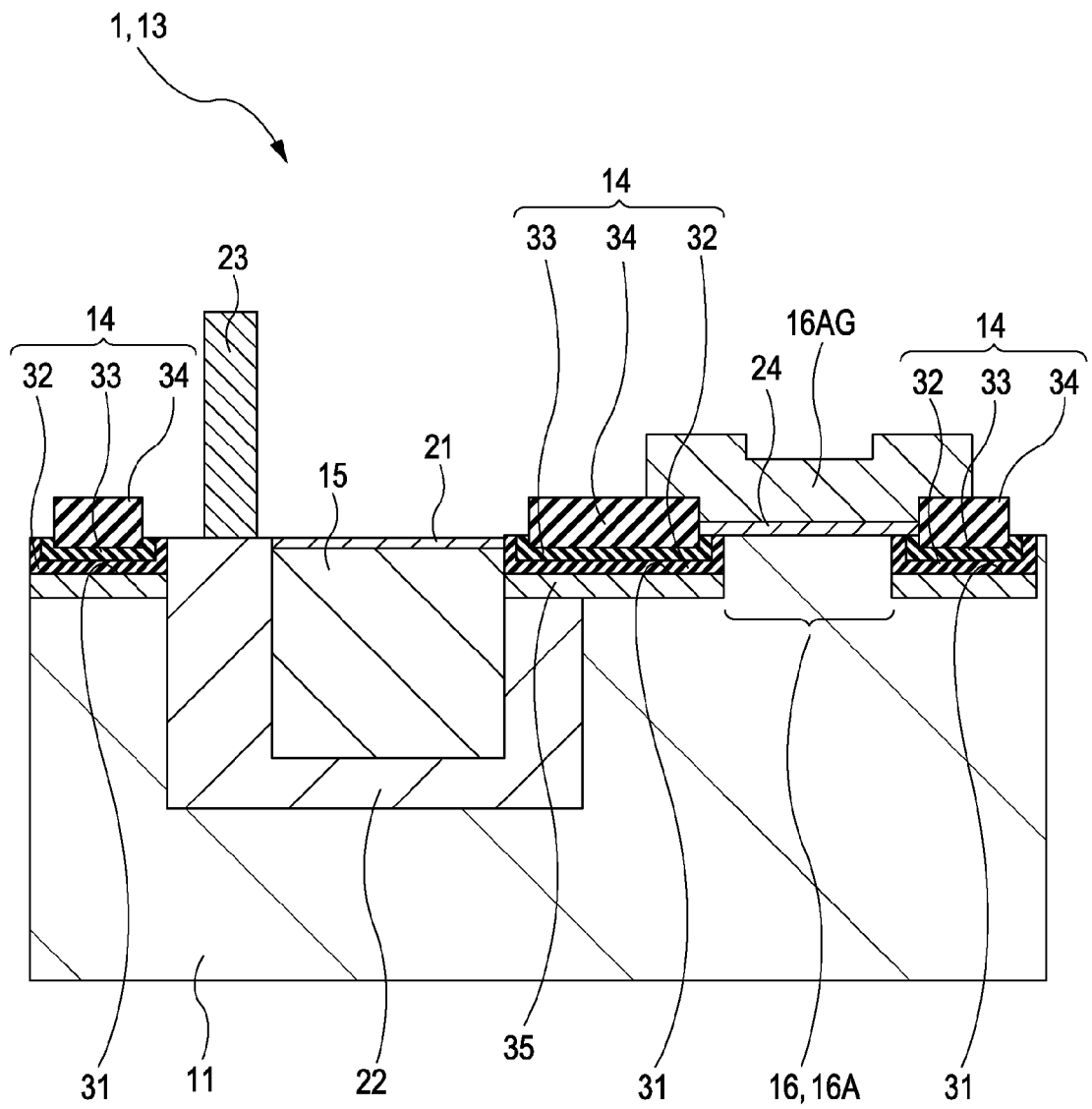
FIG. 1 is a schematic configuration sectional view showing an example of a solid-state imaging device, according to a first embodiment of the present invention.

One example of the configuration of a solid-state imaging device according to a first embodiment of the present invention will be described with reference to a schematic configuration sectional view shown in FIG. 1, a plane layout diagram shown in FIG. 2A, and a circuit diagram shown in FIG. 2B. FIG. 1 is a diagram schematically showing a section taken along a line I-I shown in FIG. 2A.

Figure 2A:
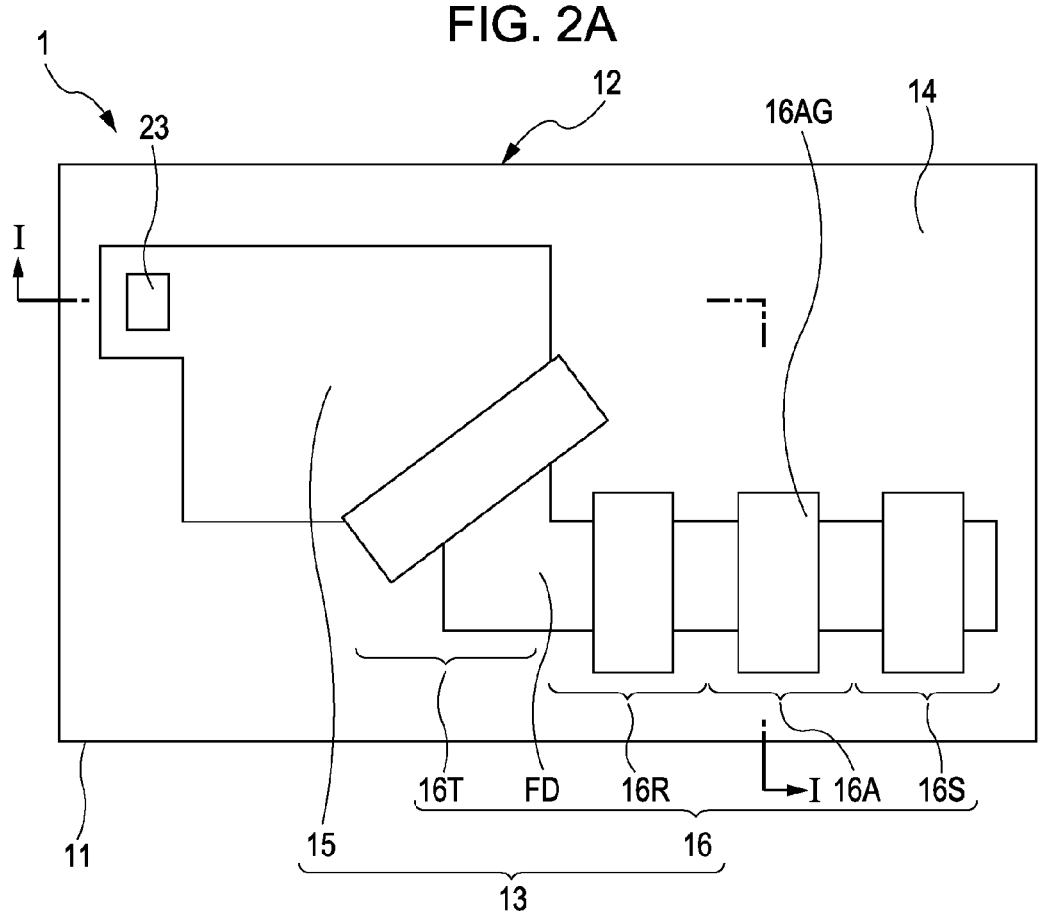
FIGS. 2A and 2B are a plane layout diagram and a circuit diagram, respectively, showing an example of a solid-state imaging device, according to the first embodiment of the present invention.
Figure 2B:
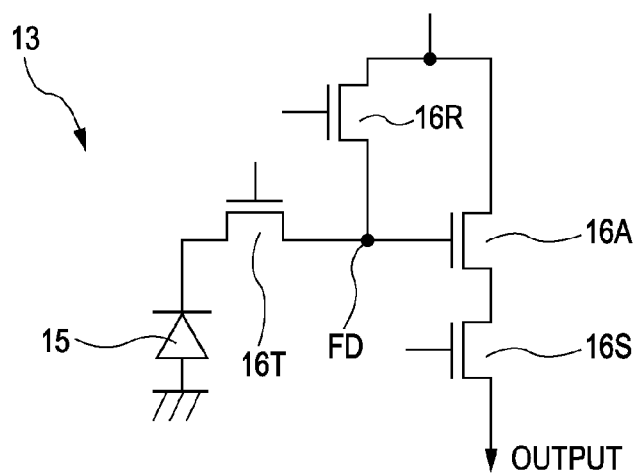

As shown in FIGS. 2A and 2B, a solid-state imaging device 1 according to an embodiment of the present invention includes a pixel portion 12, in which a plurality of pixels 13 (one typical pixel is shown in the drawing) are arranged on a semiconductor substrate 11, and a peripheral circuit portion (not shown in the drawing) disposed in the periphery of the pixel portion 12. Furthermore, the above-described pixel portion 12 includes element isolation regions 14 to isolate individual pixels 13. Moreover, the above-described pixel portion 12 and the peripheral circuit portion are isolated by an element isolation region (not shown in the drawing) other than the above-described element isolation regions 14.

The above-described pixel 13 includes a photoelectric conversion portion 15 and a pixel transistor portion 16.

The above-described photoelectric conversion portion 15 photoelectrically converts incident light to obtain a signal charge and is formed from, for example, a photodiode.

The above-described pixel transistor portion 16 converts the signal charge read from the above-described photoelectric conversion portion 15 to a voltage. For example, a transfer transistor (may be referred to as a reading transistor) 16T, a reset transistor 16R, an amplifying transistor 16A, and a selection transistor 16S are arranged sequentially from the above-described photoelectric conversion portion 15 side. In this regard, a diffusion layer common to the above-described transfer transistor 16T and the above-described reset transistor 16R constitutes floating diffusion FD. The floating diffusion FD is connected to a gate electrode 16AG of the amplifying transistor 16A (not shown in FIG. 2A).

In addition, the above-described peripheral circuit portion includes a pixel vertical scanning circuit, a horizontal scanning circuit, a drive circuit, a timing generation circuit, and the like.

The above-described pixel 13 will be described below in detail with reference to FIG. 1. In the drawing, the amplifying transistor 16A is shown as a representative of the pixel transistor portion 16.

As shown in FIG. 1, the photoelectric conversion portion 15 and the pixel transistor portion 16 (the amplifying transistor 16A, and the reset transistor, the selection transistor, and the like although not shown in the drawing) isolated by the element isolation region 14 are disposed on the semiconductor substrate 11.

A P-type diffusion layer 21 is disposed on the surface of the above-described photoelectric conversion portion 15 in order to suppress noise.

Furthermore, a P-type diffusion layer 22 is disposed around the above-described photoelectric conversion portion 15 in order to isolate the photoelectric conversion portion 15 from the surroundings. An electrode portion 23 is disposed on the P-type diffusion layer 22 in order to fix the potential of the P-type diffusion layer 22 at a constant value.

Regarding the above-described amplifying transistor 16A, the gate electrode 16AG is disposed on the semiconductor substrate 11 with an gate insulating film 24 therebetween, and source-drain regions (not shown in the drawing) are disposed on both sides of this gate electrode 16AG (channel length direction: direction perpendicular to the drawing). Although not shown in the drawing, the reset transistor, the selection transistor, and the transfer transistor have similar configurations. However, regarding the transfer transistor, one of the source-drain regions also serves as an N-type region of the photoelectric conversion portion, and the other serves as the floating diffusion FD (refer to FIG. 2A).

The above-described element isolation region 14 is disposed on a trench 31 in such a way as to fill the trench 31 disposed in the semiconductor substrate 11. That is, a silicon oxide film 32 is disposed on the inner surface of the above-described trench 31, and an insulating film 33 having a negative charge is disposed on the surface of the silicon oxide film 32. Furthermore, a buried insulating film 34 is disposed in the trench 31 with the above-described silicon oxide film 32 and the insulating film 33 having a negative charge therebetween in such a way as to have a height higher than the surface of the semiconductor substrate 11.

The above-described insulating film 33 having a negative charge is formed from, for example, a hafnium oxide ($HfO_2$) film, a zirconium oxide ($ZrO_2$) film, an aluminum oxide ($Al_2O_3$) film, a tantalum oxide ($Ta_2O_5$) film, a titanium oxide ($TiO_2$) film, or an yttrium oxide ($Y_2O_3$) film.

As for the above-described insulating film 33 having a negative charge, a film formed by a chemical vapor deposition method, a sputtering method, an atomic layer deposition (ALD) method, or the like may be used. However, the film which has a good interface to a substrate and which is formed by the atomic layer deposition method is favorable.

Furthermore, it is favorable to use the atomic layer deposition method because about 1 nm of silicon oxide ($SiO_2$) layer, which reduces the interface state, can be formed at the same time during film formation. In this case, formation of the above-described silicon oxide film 32 may be omitted.

Examples of the materials other than those described above include lanthanoid oxides, e.g., lanthanum oxide ($La_2O_3$), cerium oxide ($CeO_2$), praseodymium oxide ($Pr_2O_3$), neodymium oxide ($Nd_2O_3$), promethium oxide ($Pm_2O_3$), samarium oxide ($Sm_2O_3$), europium oxide ($Eu_2O_3$), gadolinium oxide ($Gd_2O_3$), terbium oxide ($Tb_2O_3$), dysprosium oxide ($Dy_2O_3$), holmium oxide ($Ho_2O_3$), erbium oxide ($Er_2O_3$), thulium oxide ($Tm_2O_3$), ytterbium oxide ($Yb_2O_3$), and lutetium oxide ($Lu_2O_3$). Moreover, the above-described insulating film 33 having a negative charge may also be formed from a hafnium nitride film, an aluminum nitride film, a hafnium oxynitride film, or an aluminum oxynitride film.

Regarding the above-described insulating film 33 having a negative charge, silicon (Si) or nitrogen (N) may be added to the film within the bounds of not impairing the insulating property. The concentration thereof is determined appropriately within the bounds of not impairing the insulating property of the film. In the case where silicon (Si) or nitrogen (N) is added as described above, it becomes possible to enhance the heat resistance of the film and improve the capability of preventing ion implantation during a process.

A P-type impurity region 35 is disposed in the above-described semiconductor substrate 11 at the bottom of the above-described trench 31. This P-type impurity region 35 is formed by doping the semiconductor substrate 11 with a P-type impurity, e.g., boron or boron difluoride. The impurity concentration of this P-type impurity region 35 may be lower than that of a P-type impurity region disposed in a semiconductor substrate under an element isolation region in the related art.

In this regard, in the case where holes can be sufficiently induced into the semiconductor substrate 11 under the above-described element isolation region 14 by the negative charge of the above-described insulating film 33 having a negative charge, it is not necessary to form the above-described P-type impurity region 35.

In addition, the above-described P-type impurity region 35 is connected to the above-described P-type impurity region 22. Therefore, the potential of the above-described P-type impurity region 35 is fixed through the above-described P-type impurity region 22.

In the above-described solid-state imaging device 1, the element isolation region 14 of the pixel portion 12 includes the insulating film 33 having a negative charge. Therefore, a hole accumulation layer resulting from the negative charge in the insulating film 33 having the negative charge is generated in the semiconductor substrate 11 immediately under the element isolation region 14. Noise generation due to defects at the interface between the element isolation region 14 and the semiconductor substrate 11 is suppressed by the hole accumulation layer.

Furthermore, since the hole accumulation layer is formed by the negative charge, it is possible that a P-type impurity region formed in the semiconductor substrate immediately under the element isolation region in the related art may be omitted.

Alternatively, in the case where a P-type impurity region 35 is formed, the concentration thereof may be reduced. That is, in the case where the above-described P-type impurity region 35 is formed, a hole accumulation effect is enhanced in addition to the hole accumulation layer resulting from the negative charge of the above-described insulating film 33 having the negative charge.

Therefore, even when the concentration of the P-type impurity region 35 is reduced, holes corresponding thereto are induced by the negative charge of the above-described insulating film 33 having a negative charge and, thereby, the hole concentration substantially equal to that of a solid-state imaging device in the related art, wherein a P-type impurity region is disposed without the above-described insulating film 33 having a negative charge, is obtained. As a result, the concentration of the above-described P-type impurity region 35 can be reduced as compared with that of the P-type impurity region disposed under the element isolation region of the solid-state imaging device in the related art.

As described above, the impurity concentration of the P-type impurity region 35 can be reduced than ever or the P-type impurity region 35 can be omitted. Therefore, diffusion of the P-type impurity into the channel region of the transistor is reduced. Consequently, the effective channel width of the transistor can be made larger than that of the solid-state imaging device in the related art.

That is, the effect of reducing the channel due to diffusion of the P-type impurity can be suppressed, while the effect becomes significant as the transistor is made finer. In particular, since reduction of the effective channel width of the amplifying transistor 16A is suppressed, the 1/f noise is reduced. Furthermore, since the effect of reducing the channel is suppressed, effects are exerted in such a way that an increase in threshold voltage of the transistor is suppressed and variations in threshold voltage are reduced.

Put another way, diffusion of the P-type impurity due to the P-type impurity region 35 is suppressed and the pixel size may be reduced correspondingly, while the effective channel width of the transistor of the pixel transistor portion 16 is ensured and the 1/f noise is reduced.

Consequently, noise suppression and a finer pixel may become mutually compatible.

Moreover, the image quality of imaging is improved because of noise reduction. In addition, finer pixels can increase the number of pixels. The image quality of imaging thereby becomes at a higher level of definition. There are advantages as described above.

If the P-type impurity of the above-described P-type impurity region 35 diffuses to the photoelectric conversion portion 15 side, adverse effects, e.g., reduction of the amount of saturation charge or deterioration of afterimage, may be exerted. However, in the above-described solid-state imaging device 1, since the above-described P-type impurity region 35 may be omitted or the concentration of the above-described P-type impurity region 35 may be reduced, reduction of the amount of saturation charge and deterioration of afterimage may be suppressed.

In some configuration of the solid-state imaging device, a region, in which a photoelectric conversion portion and a transfer transistor are formed, and a pixel transistor portion, in which a reset transistor, an amplifying transistor, and a selection transistor are formed, are completely isolated by the element isolation region. The solid-state imaging device having such a configuration may has the same configuration as that of the solid-state imaging device 1 according to an embodiment of the present invention in which the insulating film having a negative charge is applied to the element isolation region thereof.

Second Embodiment

First Example of Method for Manufacturing Solid-State Imaging Device

A first example of a method for manufacturing a solid-state imaging device, according to a second embodiment of the present invention, will be described with reference to sectional views of production steps shown in FIG. 3A to FIG. 4E.

Figure 3A:
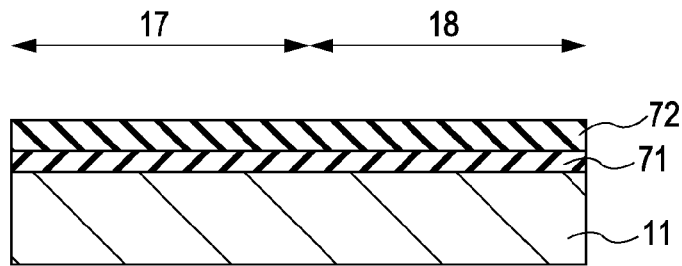
FIGS. 3A to 3E are sectional views showing production steps of a first example of a method for manufacturing a solid-state imaging device, according to a second embodiment of the present invention.

As shown in FIG. 3A, a silicon oxide film 71 and a silicon nitride film 72 are formed sequentially on a semiconductor substrate 11. For example, a silicon substrate is used for the above-described semiconductor substrate 11.

Figure 3B:
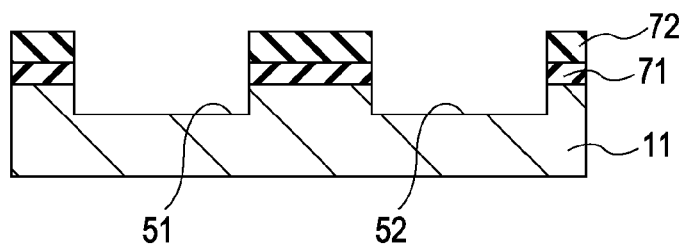

Then, as shown in FIG. 3B, a resist mask (not shown in the drawing) for forming element isolation trenches is formed on the above-described silicon nitride film 72. The resulting mask is used as an etching mask and the above-described silicon nitride film 72, the above-described silicon oxide film 71, and the above-described semiconductor substrate 11 are etched. That is, a first trench 51 for element isolation is formed in a pixel region 17 of the semiconductor substrate 11 and a second trench 52 for element isolation is formed in a peripheral circuit region 18.

The digging depths of the semiconductor substrate 11 for the above-described first trench 51 and the second trench 52 are determined on the basis of the film thickness of an insulating film of an element isolation region formed in the pixel portion. The above-described digging depth is specified to be, for example, 150 nm or less, and preferably about 50 nm.

Thereafter, the above-described resist mask is removed.

Figure 3C:
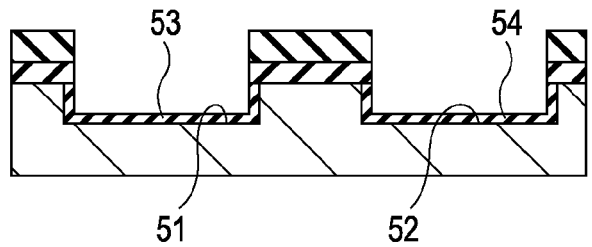

Next, as shown in FIG. 3C, a silicon oxide film 53 is formed on the inner surface of the above-described first trench 51, and a silicon oxide film 54 is formed on the inner surface of the above-described second trench 52. The above-described silicon oxide films 53 and 54 are formed through oxidation of the above-described semiconductor substrate 11 exposed at insides of the above-described first trench 51 and the second trench 52 by, for example, a thermal oxidation method.

Therefore, defects present at the interfaces of the above-described first trench 51 and the second trench 52 to the above-described semiconductor substrate 11 are reduced by the silicon oxide films 53 and 54.

However, as the film thicknesses of the above-described silicon oxide films 53 and 54 increase, an effect of a film, which is buried thereafter and which has a negative charge, on induction of holes into the semiconductor substrate 11 is reduced.

Consequently, it is preferable that the film thicknesses of the above-described silicon oxide films 53 and 54 are 5 nm or less.

Figure 3D:
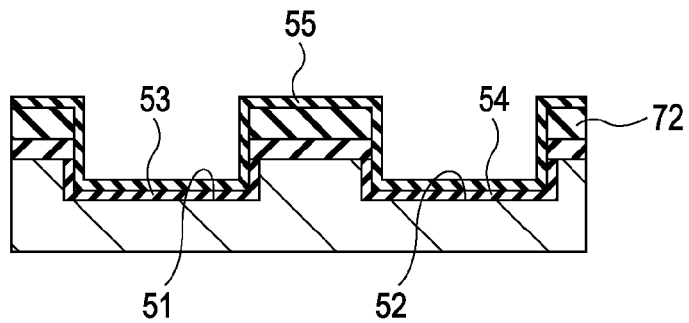

Then, as shown in FIG. 3D, an insulating film 55 having a negative charge is formed on the inner surfaces of the above-described first trench 51 and the above-described second trench 52 with the above-described silicon oxide films 53 and 54 therebetween. This insulating film 55 having a negative charge is also formed on the above-described silicon nitride film 72.

The above-described insulating film 55 having a negative charge is formed from, for example, a hafnium oxide ($HfO_2$) film, a zirconium oxide ($ZrO_2$) film, an aluminum oxide ($Al_2O_3$) film, a tantalum oxide ($Ta_2O_5$) film, a titanium oxide ($TiO_2$) film, or an yttrium oxide ($Y_2O_3$) film.

Examples of film formation methods include a chemical vapor deposition method, a sputtering method, and an atomic layer deposition (ALD) method. In order to provide a good interface to a substrate, it is favorable to use the atomic layer deposition method.

Furthermore, it is favorable to use the atomic layer deposition method because about 1 nm of silicon oxide ($SiO_2$) layer, which reduces the interface state, can be formed at the same time during film formation. In this case, the step of forming the above-described silicon oxide films 53 and 54 may be omitted.

In the case where the above-described hafnium oxide film is formed by, for example, the atomic layer deposition method, tetrakis ethyl methyl amino hafnium (TEMAHf) and ozone are used as raw material gases. In the case where the above-described zirconium oxide film is formed, tetrakis ethyl methyl amino zirconium (TEMAZr) and ozone are used as raw material gases. In the case where the above-described aluminum oxide film is formed, trimethylamine (TMA) and ozone are used as raw material gases. In the case where the above-described titanium oxide film is formed, titanium tetrachloride ($TiCl_4$) and ozone are used as raw material gases. In the case where the above-described tantalum oxide film is formed, tantalum pentaethoxide (PET: $Ta(OC_2H_5)_5$) and ozone are used as raw material gases.

Examples of the materials other than those described above include lanthanoid oxides, e.g., lanthanum oxide ($La_2O_3$), cerium oxide ($CeO_2$), praseodymium oxide ($Pr_2O_3$), neodymium oxide ($Nd_2O_3$), promethium oxide ($Pm_2O_3$), samarium oxide ($Sm_2O_3$), europium oxide ($Eu_2O_3$), gadolinium oxide ($Gd_2O_3$), terbium oxide ($Tb_2O_3$), dysprosium oxide ($Dy_2O_3$), holmium oxide ($Ho_2O_3$), erbium oxide ($Er_2O_3$), thulium oxide ($Tm_2O_3$), ytterbium oxide ($Yb_2O_3$), and lutetium oxide ($Lu_2O_3$). Moreover, the above-described insulating film 55 having a negative charge may also be formed from a hafnium nitride film, an aluminum nitride film, a hafnium oxynitride film, or an aluminum oxynitride film.

Regarding the above-described insulating film 55 having a negative charge, silicon (Si) or nitrogen (N) may be added to the film within the bounds of not impairing the insulating property. The concentration thereof is determined appropriately within the bounds of not impairing the insulating property of the film. In the case where silicon (Si) or nitrogen (N)

is added as described above, it becomes possible to enhance the heat resistance of the film and improve the capability of preventing ion implantation during the process.

Figure 3E:
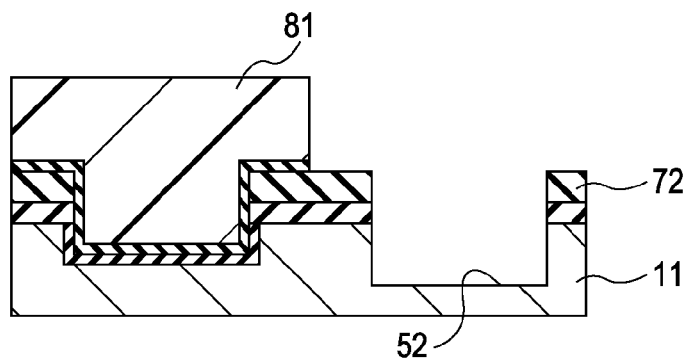

Subsequently, as shown in FIG. 3E, a resist mask 81 covering the pixel region 17 is formed through application of the resist and the lithography. The resulting resist mask 81 is used as an etching mask and the above-described insulating film 55 which is formed in the above-described peripheral circuit region 18 and which has a negative charge is removed. At this time, the above-described silicon oxide film 54 (refer to FIG. 3C) is also removed.

As a result, the above-described insulating film 55 having a negative charge is left in the pixel region 17.

In addition, the above-described silicon nitride film 72 is used as a hard mask and the above-described second trench 52 is further dug into the above-described semiconductor substrate 11, while the above-described resist mask is disposed.

Thereafter, the above-described resist mask 81 is removed. The drawing shows the state just before the resist mask 81 is removed.

Figure 4A:
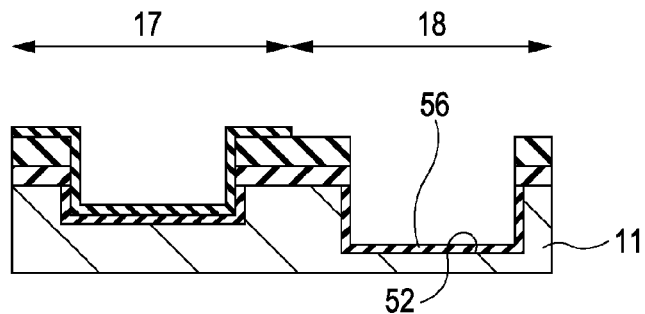
FIGS. 4A to 4E are sectional views showing production steps of the first example of the method for manufacturing a solid-state imaging device, according to the second embodiment of the present invention.

Next, as shown in FIG. 4A, a silicon oxide film 56 is formed on the inner surface of the second trench 52 in the peripheral circuit region 18. The above-described silicon oxide film 56 is formed through oxidation of the above-described semiconductor substrate 11 exposed at an inside of the above-described second trench 52 by, for example, the thermal oxidation method.

Therefore, defects present at the interface of the above-described second trench 52 to the above-described semiconductor substrate 11 are reduced by the silicon oxide film 56.

Figure 4B:
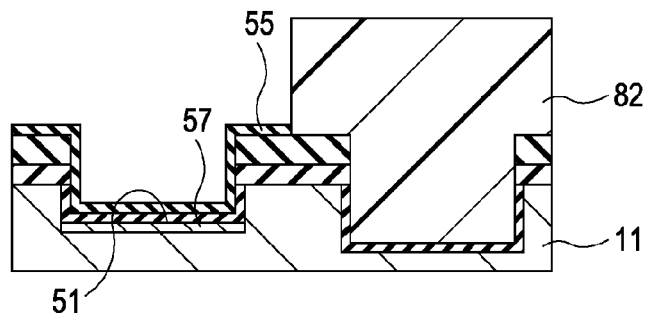

Then, as shown in FIG. 4B, a resist mask 82 covering the peripheral circuit region 18 is formed through application of the resist and the lithography. The resulting mask 82 is used as an ion implantation mask and the above-described semiconductor substrate 11 at the bottom of the above-described first trench 51 is doped with a P-type impurity (for example, boron or boron difluoride) so as to form a P-type impurity region 57.

In this regard, in the case where holes can be sufficiently induced into the semiconductor substrate 11 under an element isolation region, which is formed in the above-described first trench 51, by the negative charge of the above-described insulating film 55 having a negative charge, it is not necessary to form the above-described P-type impurity region 57.

In the present process, a P-type impurity is implanted in addition to holes induced by the negative charge of the above-described insulating film 55 having a negative charge.

As a matter of course, even when the concentration of the P-type impurity region 57 is reduced, holes are induced by the negative charge of the above-described insulating film 55 having a negative charge and, thereby, the hole concentration substantially equal to that of a process in the related art, wherein the above-described insulating film 55 having a negative charge is not provided, is obtained. As a result, the concentration of the P-type impurity region 57 can be reduced as compared with that in the related art.

Thereafter, the above-described resist mask 82 is removed. The drawing shows the state just before the resist mask 82 is removed.

Figure 4C:
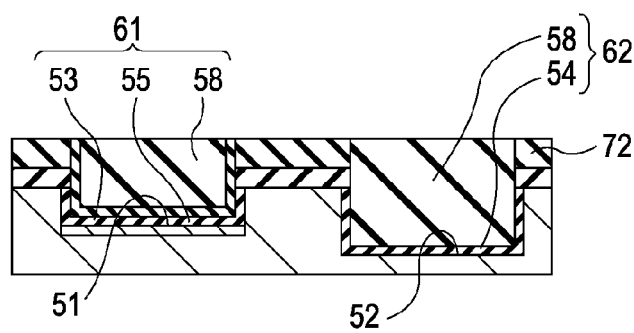

Subsequently, as shown in FIG. 4C, a buried insulating film 58 is formed on the above-described silicon nitride film 72 in such a way that the above-described first trench 51 and the above-described second trench 52 are filled. This buried insulating film 58 is formed from a silicon oxide film by, for example, a chemical vapor deposition (CVD) method.

Thereafter, an excess buried insulating film 58 and the insulating film 55 having a negative charge on the above-described silicon nitride film 72 are removed and flattening is conducted. As for the flattening, for example, a chemical mechanical polishing (CMP) method is used. As a result, a first element isolation region 61 is formed in the inside of the above-described first trench 51 and a second element isolation region 62 is formed in the inside of the second trench 52.

Therefore, the above-described first element isolation region 61 includes the above-described insulating film 55 having a negative charge under the above-described buried insulating film 58 and further includes the silicon oxide film 53. Moreover, the above-described second element isolation region 62 includes the silicon oxide film 54 under the above-described buried insulating film 58.

Figure 4D:
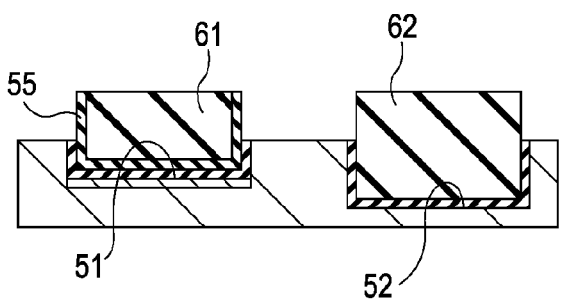

Next, as shown in FIG. 4D, the above-described silicon nitride film 72 (refer to FIG. 4C) and the above-described silicon oxide film 71 (refer to FIG. 3B) are removed.

Consequently, the first element isolation region 61 including the above-described insulating film 55 having a negative charge is formed on the first trench 51 disposed in the pixel region 17, and the second element isolation region 62 is formed on the second trench 52 disposed in the peripheral circuit region 18.

Figure 4E:
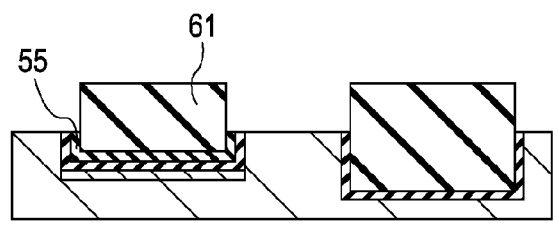

Alternatively, as shown in FIG. 4E, the insulating film 55 having a negative charge (refer to FIG. 4D) exposed at the side wall of the first element isolation region 61 in the pixel region 17 may be removed through etching, as necessary. The drawing shows the state after the removal is conducted.

After the above-described first and second element isolation regions 61 and 62 are formed, although not shown in the drawing, a process for a CMOS image sensor in the related art is conducted. For example, a photoelectric conversion portion (for example, a photodiode), a photoelectric conversion portion isolation region, a pixel transistor, a peripheral circuit portion, a wiring, and the like are formed. For example, in the formation of the above-described pixel transistor, a transfer transistor (reading transistor), a reset transistor, an amplifying transistor, a selection transistor, and the like are formed. In the formation of the above-described peripheral circuit portion, a pixel vertical scanning circuit, a horizontal scanning circuit, a drive circuit, a timing generation circuit, and the like are formed. In the formation of the above-described wiring, for example, an output signal line, a transfer signal line, a reset control line, a selection control line, and a reset voltage supply reset line are formed.

Then, as shown in FIG. 1 described above, the photoelectric conversion portion 15 is isolated by the P-type diffusion layer 22. This P-type diffusion layer 22 is in contact with the element isolation region 14 (corresponding to the first element isolation region 61 in the first example of the manufacturing method) and is electrically continuous with the P-type impurity region 35 (corresponding to the P-type impurity region 57 in the first example of the manufacturing method) disposed under the element isolation region 14. Furthermore, the P-type diffusion layer 22 is connected to the electrode portion 23 to fix the potential. Therefore, the potential of the P-type impurity region 35 is also fixed. Moreover, the potential of the hole accumulation layer induced under the element isolation region 14 by the insulating film 33 having a negative charge (corresponding to the insulating film 55 having a negative charge in the first example of the manufacturing method) is also fixed through the P-type diffusion layer 22.

In the first example of the above-described method for manufacturing a solid-state imaging device, the insulating film 55 having a negative charge is formed in the first element isolation region 61 disposed in the pixel portion. Therefore, a hole accumulation layer (not shown in the drawing) resulting from the negative charge of the insulating film 55 having a negative charge is induced into the semiconductor substrate 11 immediately under the first element isolation region 61. Noise generation due to defects at the interface between the first element isolation region 61 and the semiconductor substrate 11 is suppressed by this hole accumulation layer.

Furthermore, since the hole accumulation layer is induced by the negative charge, a P-type impurity region is not formed in the semiconductor substrate immediately under the element isolation region, in contrast to that in the related art. Alternatively, in the case where the P-type impurity region 57 is formed, the concentration thereof is reduced.

Consequently, the effect of reducing the channel due to diffusion of the P-type impurity in the P-type impurity region 57 can be suppressed, while the effect becomes significant as the transistor is made finer. In particular, since reduction of the effective channel width of the amplifying transistor is suppressed, the 1/f noise is reduced. Moreover, since the effect of reducing the channel is suppressed, effects are exerted in such a way that an increase in threshold voltage of the transistor is suppressed and variations in threshold voltage are reduced.

Put another way, diffusion of the P-type impurity due to the P-type impurity region 57 is suppressed and the pixel size may be reduced correspondingly, while the effective channel width of the transistor of the pixel transistor portion is ensured and the 1/f noise is reduced.

Consequently, noise suppression and a finer pixel may become mutually compatible.

In addition, the image quality of imaging is improved because of noise reduction. Furthermore, finer pixels can increase the number of pixels. The image quality of imaging thereby becomes at a higher degree of definition. There are advantages as described above.

In the first example of the above-described method for manufacturing a solid-state imaging device, regarding the step shown in FIG. 3B, the first trench 51 and the second trench 52 are formed in the semiconductor substrate 11. However, the trenches may be formed only in the above-described silicon nitride film 72 and the silicon oxide film 71 on the above-described semiconductor substrate 11 without being formed in the above-described semiconductor substrate 11. In this case, the insulating film 55 having a negative charge is formed on the surface of the above-described semiconductor substrate 11 exposed at the bottom of the first trench 51 formed in the above-described silicon nitride film 72 and the silicon oxide film 71 with the silicon oxide film 53 therebetween. Thereafter, the second trench 52 is dug into the semiconductor substrate 11 in the step shown in FIG. 3E. The steps thereafter are the same as those in the first example of the above-described manufacturing method.

Third Embodiment

Second Example of Method for Manufacturing Solid-State Imaging Device

A second example of a method for manufacturing a solid-state imaging device, according to a third embodiment of the present invention, will be described with reference to sectional views of production steps shown in FIG. 5A to FIG. 6F.

Figure 5A:
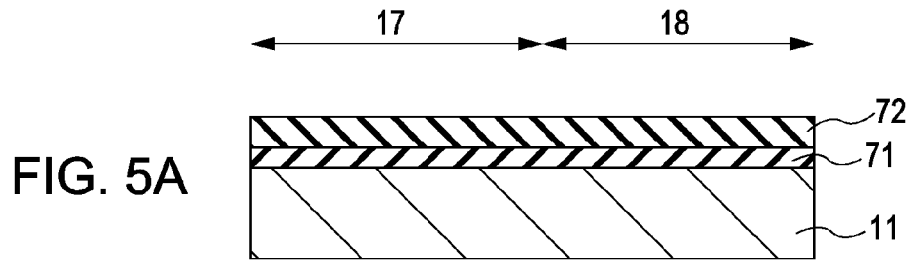
FIGS. 5A to 5E are sectional views showing production steps of a second example of a method for manufacturing a solid-state imaging device, according to a third embodiment of the present invention.

As shown in FIG. 5A, a silicon oxide film 71 and a silicon nitride film 72 are formed sequentially on a semiconductor substrate 11. For example, a silicon substrate is used for the above-described semiconductor substrate 11.

Figure 5B:
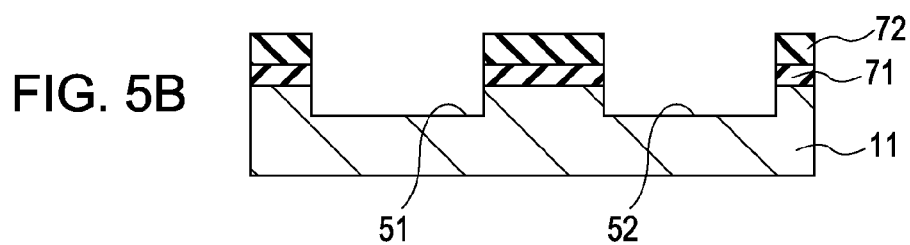

As shown in FIG. 5B, a resist mask (not shown in the drawing) for forming element isolation trenches on the above-described silicon nitride film 72 is formed. The resulting mask is used as an etching mask and the above-described silicon nitride film 72, the above-described silicon oxide film 71, and the above-described semiconductor substrate 11 are etched. That is, a first trench 51 for element isolation is formed in a pixel region 17 of the above-described semiconductor substrate 11 and a second trench 52 for element isolation is formed in a peripheral circuit region 18.

The digging depths of the semiconductor substrate 11 for the above-described first trench 51 and the second trench 52 are determined on the basis of the film thickness of an insulating film of an element isolation region formed in the pixel portion. The above-described digging depth is specified to be, for example, 150 nm or less, and preferably about 50 nm.

Thereafter, the above-described resist mask is removed.

Figure 5C:
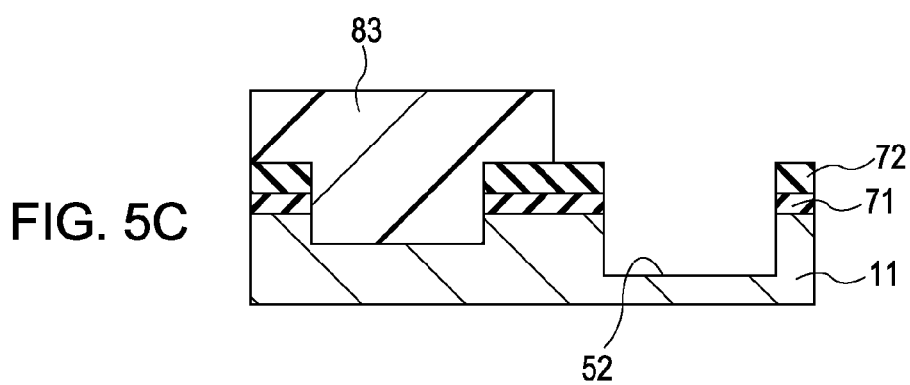

As shown in FIG. 5C, a resist mask 83 covering the pixel region 17 is formed through application of the resist and the lithography. The resulting resist mask 83 is used as an etching mask, the above-described silicon nitride film 72 is used as a hard mask, and the above-described second trench 52 is further dug into the above-described semiconductor substrate 11.

Thereafter, the above-described resist mask 83 is removed. The drawing shows the state just before the resist mask 83 is removed.

Figure 5D:
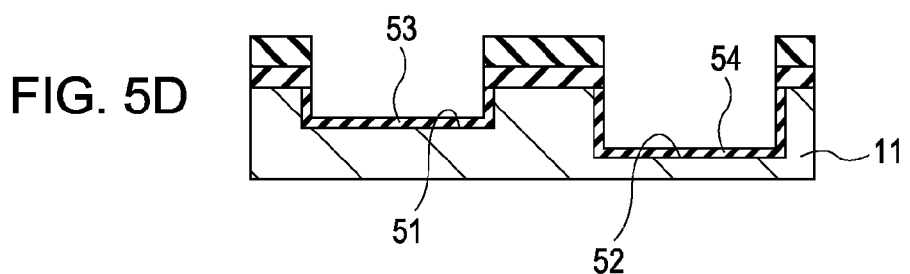

As shown in FIG. 5D, a silicon oxide film 53 is formed on the inner surface of the above-described first trench 51, and a silicon oxide film 54 is formed on the inner surface of the above-described second trench 52. The above-described silicon oxide films 53 and 54 are formed through oxidation of the above-described semiconductor substrate 11 exposed at insides of the above-described first trench 51 and the second trench 52 by, for example, a thermal oxidation method.

Therefore, defects present at the interfaces of the above-described first trench 51 and the second trench 52 to the above-described semiconductor substrate 11 are reduced by the silicon oxide films 53 and 54.

However, as the film thicknesses of the above-described silicon oxide films 53 and 54 increase, an effect of a film, which is buried thereafter and which has a negative charge, on induction of holes into the semiconductor substrate 11 is reduced.

Consequently, it is preferable that the film thicknesses of the above-described silicon oxide films 53 and 54 are 5 nm or less.

Figure 5E:
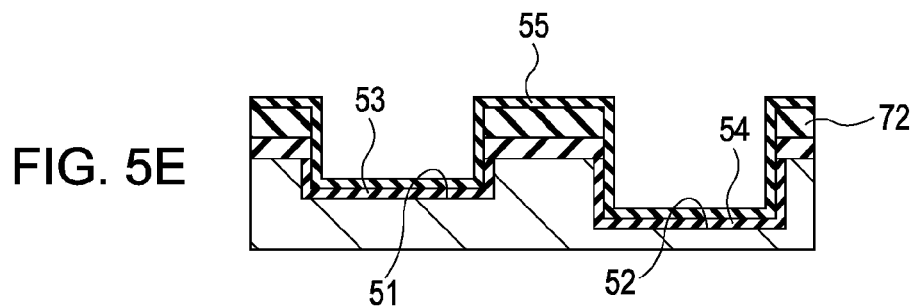

As shown in FIG. 5E, an insulating film 55 having a negative charge is formed on the inner surfaces of the above-described first trench 51 and the above-described second trench 52 with the above-described silicon oxide films 53 and 54 therebetween. This insulating film 55 having a negative charge is also formed on the above-described silicon nitride film 72.

The above-described insulating film 55 having a negative charge is formed from, for example, a hafnium oxide ($HfO_2$) film, a zirconium oxide ($ZrO_2$) film, an aluminum oxide ($Al_2O_3$) film, a tantalum oxide ($Ta_2O_5$) film, a titanium oxide ($TiO_2$) film, or an yttrium oxide ($Y_2O_3$) film.

Examples of film formation methods include a chemical vapor deposition method, a sputtering method, and an atomic layer deposition (ALD) method. In order to provide a good interface to a substrate, it is favorable to use the atomic layer deposition method.

Furthermore, it is favorable to use the atomic layer deposition method because about 1 nm of silicon oxide ($SiO_2$) layer, which reduces the interface state, can be formed at the same time during film formation. In this case, the step of forming the above-described silicon oxide films 53 and 54 may be omitted.

In the case where the above-described hafnium oxide film is formed by, for example, the atomic layer deposition method, tetrakis ethyl methyl amino hafnium (TEMAHf) and ozone are used as raw material gases. In the case where the above-described zirconium oxide film is formed, tetrakis ethyl methyl amino zirconium (TEMAZr) and ozone are used as raw material gases. In the case where the above-described aluminum oxide film is formed, trimethylamine (TMA) and ozone are used as raw material gases. In the case where the above-described titanium oxide film is formed, titanium tetrachloride ($TiCl_4$) and ozone are used as raw material gases. In the case where the above-described tantalum oxide film is formed, tantalum pentaethoxide (PET: $Ta(OC_2H_5)_5$) and ozone are used as raw material gases.

Examples of the materials other than those described above include lanthanoid oxides, e.g., lanthanum oxide ($La_2O_3$), cerium oxide ($CeO_2$), praseodymium oxide ($Pr_2O_3$), neodymium oxide ($Nd_2O_3$), promethium oxide ($Pm_2O_3$), samarium oxide ($Sm_2O_3$), europium oxide ($Eu_2O_3$), gadolinium oxide ($Gd_2O_3$), terbium oxide ($Tb_2O_3$), dysprosium oxide ($Dy_2O_3$), holmium oxide ($Ho_2O_3$), erbium oxide ($Er_2O_3$), thulium oxide ($Tm_2O_3$), ytterbium oxide ($Yb_2O_3$), and lutetium oxide ($Lu_2O_3$). Moreover, the above-described insulating film 55 having a negative charge may also be formed from a hafnium nitride film, an aluminum nitride film, a hafnium oxynitride film, or an aluminum oxynitride film.

Regarding the above-described insulating film 55 having a negative charge, silicon (Si) or nitrogen (N) may be added to the film within the bounds of not impairing the insulating property. The concentration thereof is determined appropriately within the bounds of not impairing the insulating property of the film. In the case where silicon (Si) or nitrogen (N) is added as described above, it becomes possible to enhance the heat resistance of the film and improve the capability of preventing ion implantation during the process.

As shown in FIG. 6A, a resist mask 84 covering the pixel region 17 is formed through application of the resist and the lithography. The resulting resist mask 84 is used as an etching mask and the above-described insulating film 55 which is formed in the above-described peripheral circuit region 18 and which has a negative charge is removed. At this time, the above-described silicon oxide film 54 (refer to FIG. 5E) is also removed.

As a result, the above-described insulating film 55 having a negative charge is left in the pixel region 17.

Thereafter, the above-described resist mask 84 is removed. The drawing shows the state just before the resist mask 84 is removed.

As shown in FIG. 6B, a silicon oxide film 56 is formed on the inner surface of the second trench 52 in the peripheral circuit region 18. The above-described silicon oxide film 56 is formed through oxidation of the above-described semiconductor substrate 11 exposed at an inside of the above-described second trench 52 by, for example, the thermal oxidation method.

Therefore, defects present at the interface of the above-described second trench 52 to the above-described semiconductor substrate 11 are reduced by the silicon oxide film 56.

As shown in FIG. 6C, a resist mask 85 covering the peripheral circuit region 18 is formed through application of the resist and the lithography. The resulting mask 85 is used as an ion implantation mask and the above-described semiconductor substrate 11 at the bottom of the above-described first trench 51 is doped with a P-type impurity (for example, boron or boron difluoride) so as to form a P-type impurity region 57.

In this regard, in the case where holes can be sufficiently induced into the semiconductor substrate 11 under an element isolation region, which is formed in the above-described first trench 51, by the negative charge of the above-described insulating film 55 having a negative charge, it is not necessary to form the above-described P-type impurity region 57.

In the present process, a P-type impurity is implanted in addition to holes induced by the negative charge of the above-described insulating film 55 having a negative charge.

As a matter of course, even when the concentration of the P-type impurity region 57 is reduced, holes are induced by the negative charge of the above-described insulating film 55 having a negative charge and, thereby, the hole concentration substantially equal to that of a process in the related art, wherein the above-described insulating film 55 having a negative charge is not provided, is obtained. As a result, the concentration of the P-type impurity region 57 can be reduced as compared with that in the related art.

Thereafter, the above-described resist mask 85 is removed. The drawing shows the state just before the resist mask 85 is removed.

As shown in FIG. 6D, a buried insulating film 58 is formed on the above-described silicon nitride film 72 in such a way that the above-described first trench 51 and the above-described second trench 52 are filled. This buried insulating film 58 is formed from a silicon oxide film by, for example, a chemical vapor deposition (CVD) method.

Thereafter, an excess buried insulating film 58 and the insulating film 55 having a negative charge on the above-described silicon nitride film 72 are removed and flattening is conducted. As for the flattening, for example, a chemical mechanical polishing (CMP) method is used. As a result, a first element isolation region 61 is formed in the inside of the above-described first trench 51 and a second element isolation region 62 is formed in the inside of the second trench 52.

Therefore, the above-described first element isolation region 61 includes the above-described insulating film 55 having a negative charge under the above-described buried insulating film 58 and further includes the silicon oxide film 53. Moreover, the above-described second element isolation region 62 includes the silicon oxide film 54 under the above-described buried insulating film 58.

As shown in FIG. 6E, the above-described silicon nitride film 72 (refer to FIG. 6D) and the above-described silicon oxide film 71 (refer to FIG. 5B) are removed.

Consequently, the first element isolation region 61 including the above-described insulating film 55 having a negative charge is formed on the first trench 51 disposed in the pixel region 17, and the second element isolation region 62 is formed on the second trench 52 disposed in the peripheral circuit region 18.

As shown in FIG. 6F, the insulating film 55 having a negative charge (refer to FIG. 6E) formed on the side wall of the first element isolation region 61 in the pixel region 17 may be removed through etching, as necessary. The drawing shows the state after the removal is conducted.

After the above-described first and the second element isolation regions 61 and 62 are formed, although not shown in the drawing, a process for a CMOS image sensor in the related art is conducted. For example, a photoelectric conversion portion (for example, a photodiode), a photoelectric conversion portion isolation region, a pixel transistor, a peripheral circuit portion, a wiring, and the like are formed. For example, in the formation of the above-described pixel transistor, a transfer transistor (reading transistor), a reset transistor, an amplifying transistor, a selection transistor, and the like are formed. In the formation of the above-described peripheral circuit portion, a pixel vertical scanning circuit, a horizontal scanning circuit, a drive circuit, a timing generation circuit, and the like are formed. In the formation of the above-described wiring, for example, an output signal line, a transfer signal line, a reset control line, a selection control line, and a reset voltage supply reset line are formed.

Then, as shown in FIG. 1 described above, the photoelectric conversion portion 15 is isolated by the P-type diffusion layer 22. This P-type diffusion layer 22 is in contact with the element isolation region 14 (corresponding to the first element isolation region 61 in the second example of the manufacturing method) and is electrically continuous with the P-type impurity region 35 (corresponding to the P-type impurity region 57 in the second example of the manufacturing method) disposed under the element isolation region 14. Furthermore, the P-type diffusion layer 22 is connected to the electrode portion 23 to fix the potential. Therefore, the potential of the P-type impurity region 35 is also fixed. Moreover, the potential of the hole accumulation layer induced under the element isolation region 14 by the insulating film 33 having a negative charge (corresponding to the insulating film 55 having a negative charge in the second example of the manufacturing method) is also fixed through the P-type diffusion layer 22.

In the second example of the above-described method for manufacturing a solid-state imaging device, the insulating film 55 having a negative charge is formed in the first element isolation region 61 disposed in the pixel portion. Therefore, a hole accumulation layer (not shown in the drawing) resulting from the negative charge of the insulating film 55 having a negative charge is induced into the semiconductor substrate 11 immediately under the first element isolation region 61. Noise generation due to defects at the interface between the first element isolation region 61 and the semiconductor substrate 11 is suppressed by this hole accumulation layer.

Furthermore, since the hole accumulation layer is induced by the negative charge, a P-type impurity region is not formed in the semiconductor substrate immediately under the element isolation region, in contrast to that in the related art. Alternatively, in the case where the P-type impurity region 57 is formed, the concentration thereof is reduced.

Consequently, the effect of reducing the channel due to diffusion of the P-type impurity in the P-type impurity region 57 can be suppressed, while the effect becomes significant as the transistor is made finer. In particular, since reduction of the effective channel width of the amplifying transistor is suppressed, the 1/f noise is reduced. Moreover, since the effect of reducing the channel is suppressed, effects are exerted in such a way that an increase in threshold voltage of the transistor is suppressed and variations in threshold voltage are reduced.

Put another way, diffusion of the P-type impurity due to the P-type impurity region 57 is suppressed and the pixel size may be reduced correspondingly, while the effective channel width of the transistor of the pixel transistor portion is ensured and the 1/f noise is reduced.

Consequently, noise suppression and a finer pixel may become mutually compatible.

In addition, the image quality of imaging is improved because of noise reduction. Furthermore, finer pixels can increase the number of pixels. The image quality of imaging thereby becomes at a higher degree of definition. There are advantages as described above.

In the second example of the above-described method for manufacturing a solid-state imaging device, regarding the step shown in FIG. 5B, the first trench 51 and the second trench 52 are formed in the semiconductor substrate 11. However, the trenches may be formed only in the above-described silicon nitride film 72 and the silicon oxide film 71 on the above-described semiconductor substrate 11 without being formed in the above-described semiconductor substrate 11. In this case, the second trench 52 is dug into the semiconductor substrate 11 in the step shown in FIG. 5C. Subsequently, in the step shown in FIG. 5D, the silicon oxide films 53 are formed on the surfaces of the above-described semiconductor substrate 11 exposed at the bottom of the first trench 51 and the inner surface of the second trench 52, the trenches being disposed in the above-described silicon nitride film 72 and the silicon oxide film 71. The steps thereafter are the same as those in the second example of the above-described manufacturing method.

Fourth Embodiment

Third Example of Method for Manufacturing Solid-State Imaging Device

A third example of a method for manufacturing a solid-state imaging device, according to a fourth embodiment of the present invention, will be described with reference to sectional views of production steps shown in FIG. 7A to FIG. 9C.

Figure 7A:
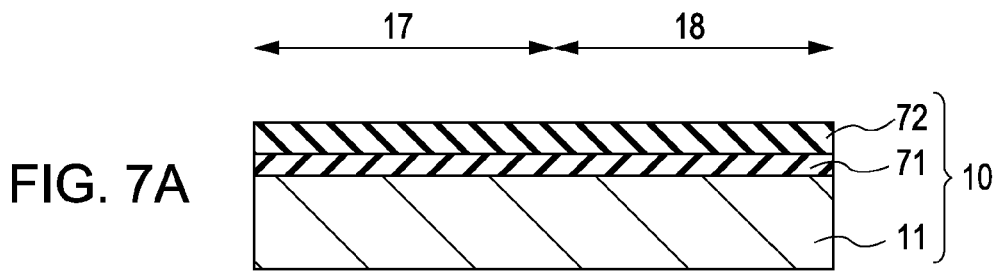
FIGS. 7A to 7E are sectional views showing production steps of a third example of a method for manufacturing a solid-state imaging device, according to a fourth embodiment of the present invention.

As shown in FIG. 7A, a silicon oxide film 71 and a silicon nitride film 72 are formed sequentially on a semiconductor substrate 11. For example, a silicon substrate is used for the above-described semiconductor substrate 11. A substrate 10 has the above-described configuration.

Figure 7B:
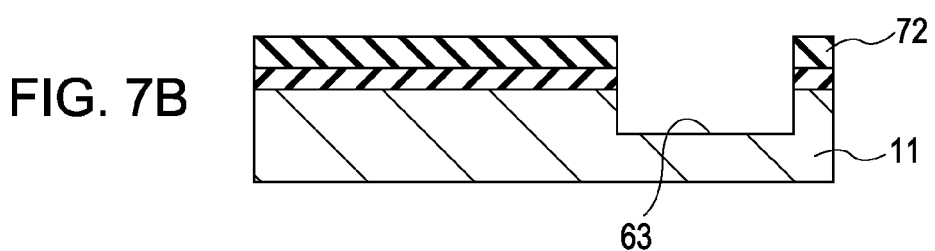

As shown in FIG. 7B, a resist mask (not shown in the drawing) for forming an element isolation trench in a peripheral circuit region 18 is formed on the above-described silicon nitride film 72. The resulting resist mask is used as an etching mask and the above-described silicon nitride film 72, the above-described silicon oxide film 71, and the above-described semiconductor substrate 11 are etched. That is, a first trench 63 for element isolation is formed in the peripheral circuit region 18 of the above-described semiconductor substrate 11.

Thereafter, the above-described resist mask is removed.

Figure 7C:
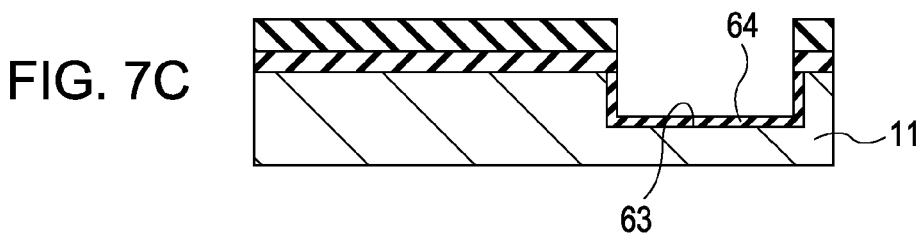

As shown in FIG. 7C, a silicon oxide film 64 is formed on the inner surface of the above-described first trench 63. The above-described silicon oxide film 64 is formed through oxidation of the above-described semiconductor substrate 11 exposed at an inside of the above-described first trench 63 by, for example, the thermal oxidation method.

Therefore, defects present at the interface of the above-described first trench 63 to the above-described semiconductor substrate 11 are reduced by the silicon oxide film 64.

Figure 7D:
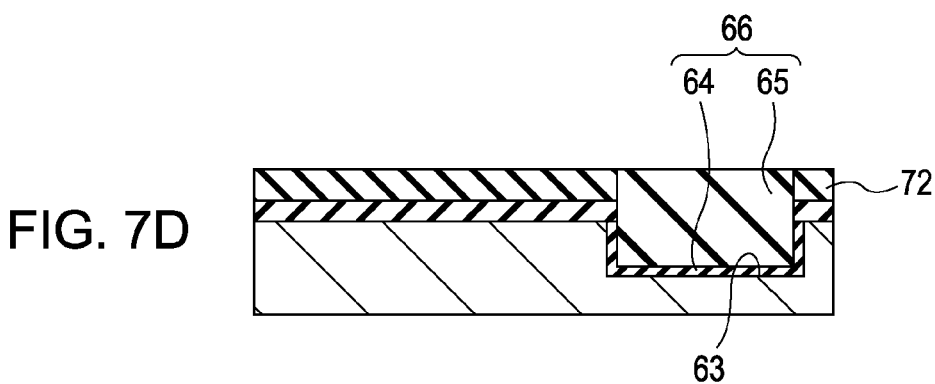

As shown in FIG. 7D, a first buried insulating film 65 is formed on the above-described silicon nitride film 72 in such a way that the above-described first trench 63 is filled. This first buried insulating film 65 is formed from a silicon oxide film by, for example, a chemical vapor deposition (CVD) method.

Thereafter, an excess first buried insulating film 65 on the above-described silicon nitride film 72 is removed and flattening is conducted. As for the flattening, for example, a chemical mechanical polishing (CMP) method is used. As a result, a first element isolation region 66 is formed in the inside of the above-described first trench 63.

Therefore, the above-described first element isolation region 66 includes the silicon oxide film 64 under the above-described first buried insulating film 65.

Figure 7E:
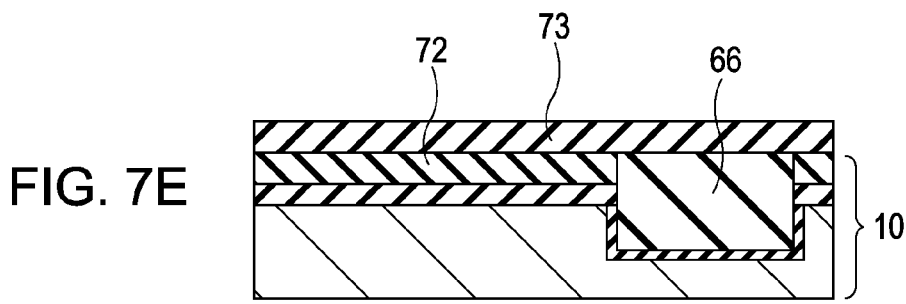

As shown in FIG. 7E, an insulating film 73 covering the above-described first element isolation region 66 is formed on the above-described substrate 10, substantially on the above-described silicon nitride film 72. This insulating film 73 is formed from, for example, a silicon nitride film. The thickness of a second element isolation region, which is formed later, of the pixel portion can be controlled by controlling the film thickness of the insulating film 73.

Figure 8A:
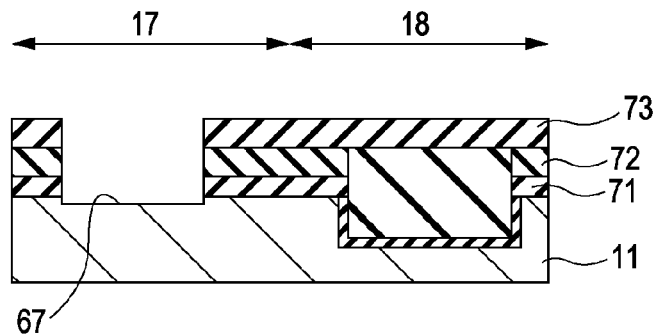
FIGS. 8A to 8D are sectional views showing production steps of the third example of the method for manufacturing a solid-state imaging device, according to the fourth embodiment of the present invention.

As shown in FIG. 8A, a resist mask (not shown in the drawing) for forming element isolation trench in the pixel region 17 on the above-described insulating film 73 is formed. The resulting resist mask is used as an etching mask and the above-described insulating layer 73, the above-described silicon nitride film 72, the above-described silicon oxide film 71, and the above-described semiconductor substrate 11 are etched. That is, a second trench 67 for element isolation is formed in a pixel region 17 of the above-described semiconductor substrate 11.

The digging depth of the semiconductor substrate 11 for the above-described second trench 67 is determined on the basis of the film thickness of an insulating film of an element isolation region formed in the pixel portion. The above-described digging depth is specified to be, for example, 150 nm or less, and preferably about 50 nm.

Thereafter, the above-described resist mask is removed.

Figure 8B:
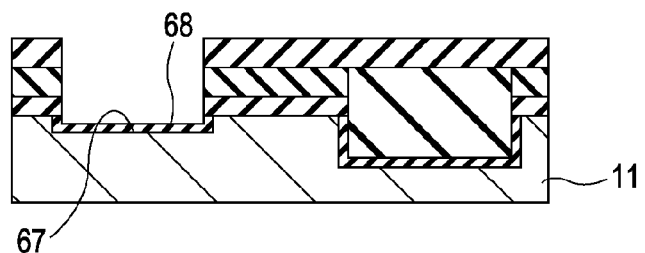

As shown in FIG. 8B, a silicon oxide film 68 is formed on the inner surface of the above-described second trench 67. The above-described silicon oxide film 68 is formed through oxidation of the above-described semiconductor substrate 11 exposed at an inside of the above-described second trench 67 by, for example, the thermal oxidation method.

Therefore, defects present at the interface of the above-described second trench 67 to the above-described semiconductor substrate 11 are reduced by the silicon oxide film 68.

However, as the film thickness of the above-described silicon oxide film 68 increases, an effect of a film, which is buried thereafter and which has a negative charge, on induction of holes into the semiconductor substrate 11 is reduced.

Consequently, it is preferable that the film thickness of the above-described silicon oxide film 68 is 5 nm or less.

Figure 8C:
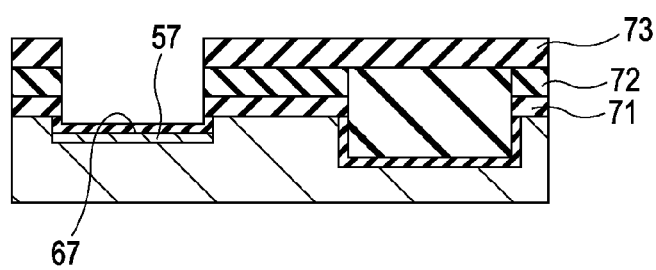

As shown in FIG. 8C, the above-described insulating layer 73, the silicon nitride film 72, the silicon oxide film 71, and the like are used as ion implantation masks and the above-described semiconductor substrate 11 at the bottom of the above-described second trench 67 is doped with a P-type impurity (for example, boron or boron difluoride) so as to form a P-type impurity region 57.

In this regard, in the case where holes can be sufficiently induced into the semiconductor substrate 11 under an element isolation region, which is formed in the above-described second trench 67, by the negative charge of an insulating film, which is formed in the following step and which has a negative charge, it is not necessary to form the above-described P-type impurity region 57.

In the present process, a P-type impurity is implanted in addition to holes induced by the negative charge of the insulating film having a negative charge.

As a matter of course, even when the concentration of the P-type impurity region 57 is reduced, holes are induced by the negative charge of the above-described insulating film having a negative charge and, thereby, the hole concentration substantially equal to that of a process in the related art, wherein the above-described insulating film having a negative charge is not provided, is obtained. As a result, the concentration of the P-type impurity region 57 can be reduced as compared with that in the related art.

Figure 8D:
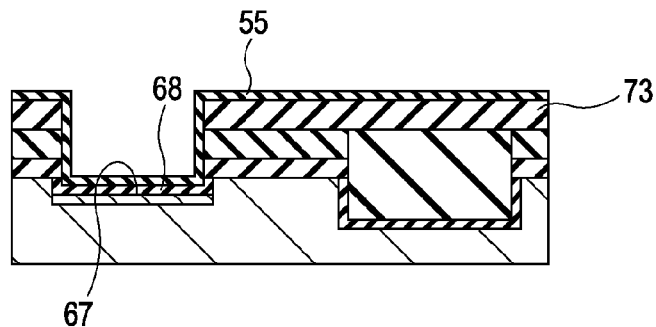

As shown in FIG. 8D, an insulating film 55 having a negative charge is formed on the inner surface of the above-described second trench 67 with the above-described silicon oxide film 68 therebetween. This insulating film 55 having a negative charge is also formed on the above-described insulating film 73.

The above-described insulating film 55 having a negative charge is formed from, for example, a hafnium oxide ($HfO_2$) film, a zirconium oxide ($ZrO_2$) film, an aluminum oxide ($Al_2O_3$) film, a tantalum oxide ($Ta_2O_5$) film, a titanium oxide ($TiO_2$) film, or an yttrium oxide ($Y_2O_3$) film.

Examples of film formation methods include a chemical vapor deposition method, a sputtering method, and an atomic layer deposition (ALD) method. In order to provide a good interface to a substrate, it is favorable to use the atomic layer deposition method.

Furthermore, it is favorable to use the atomic layer deposition method because about 1 nm of silicon oxide ($SiO_2$) layer, which reduces the interface state, can be formed at the same time during film formation. In this case, the step of forming the above-described silicon oxide film 68 may be omitted.

In the case where the above-described hafnium oxide film is formed by, for example, the atomic layer deposition method, tetrakis ethyl methyl amino hafnium (TEMAHf) and ozone are used as raw material gases. In the case where the above-described zirconium oxide film is formed, tetrakis ethyl methyl amino zirconium (TEMAZr) and ozone are used as raw material gases. In the case where the above-described aluminum oxide film is formed, trimethylamine (TMA) and ozone are used as raw material gases. In the case where the above-described titanium oxide film is formed, titanium tetrachloride ($TiCl_4$) and ozone are used as raw material gases. In the case where the above-described tantalum oxide film is formed, tantalum pentaethoxide (PET: $Ta(OC_2H_5)_5$) and ozone are used as raw material gases.

Examples of the materials other than those described above include lanthanoid oxides, e.g., lanthanum oxide ($La_2O_3$), cerium oxide ($CeO_2$), praseodymium oxide ($Pr_2O_3$), neodymium oxide ($Nd_2O_3$), promethium oxide ($Pm_2O_3$), samarium oxide ($Sm_2O_3$), europium oxide ($Eu_2O_3$), gadolinium oxide ($Gd_2O_3$), terbium oxide ($Tb_2O_3$), dysprosium oxide ($Dy_2O_3$), holmium oxide ($Ho_2O_3$), erbium oxide ($Er_2O_3$), thulium oxide ($Tm_2O_3$), ytterbium oxide ($Yb_2O_3$), and lutetium oxide ($Lu_2O_3$). Moreover, the above-described insulating film 55 having a negative charge may also be formed from a hafnium nitride film, an aluminum nitride film, a hafnium oxynitride film, or an aluminum oxynitride film.

Regarding the above-described insulating film 55 having a negative charge, silicon (Si) or nitrogen (N) may be added to the film within the bounds of not impairing the insulating property. The concentration thereof is determined appropriately within the bounds of not impairing the insulating property of the film. In the case where silicon (Si) or nitrogen (N) is added as described above, it becomes possible to enhance the heat resistance of the film and improve the capability of preventing ion implantation during the process.

Figure 9A:
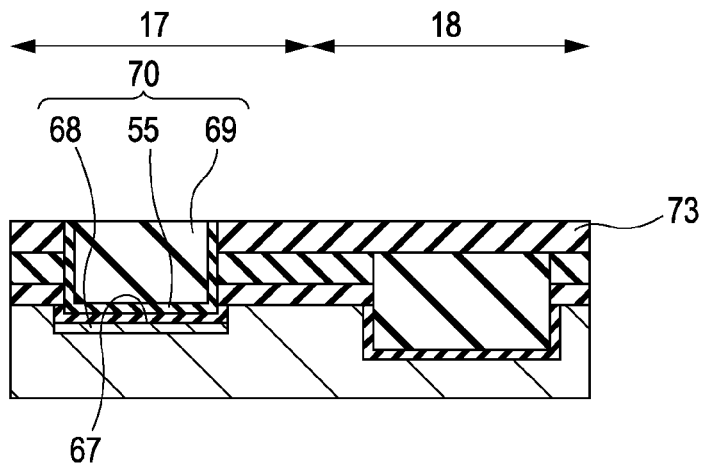
FIGS. 9A to 9C are sectional views showing production steps of the third example of the method for manufacturing a solid-state imaging device, according to the fourth embodiment of the present invention.

As shown in FIG. 9A, a second buried insulating film 69 is formed on the above-described insulating film 73 in such a way that the above-described second trench 67 is filled. This second buried insulating film 69 is formed from a silicon oxide film by, for example, a chemical vapor deposition (CVD) method.

Thereafter, an excess second buried insulating film 69 and the insulating film 55 having a negative charge on the above-described insulating film 73 are removed and flattening is conducted. As for the flattening, for example, a chemical mechanical polishing (CMP) method is used. As a result, a second element isolation region 70 is formed in the inside of the above-described second trench 67.

Therefore, the above-described second element isolation region 70 includes the above-described silicon oxide film 68 and the insulating film 55 having a negative charge under the above-described second buried insulating film 69.

Figure 9B:
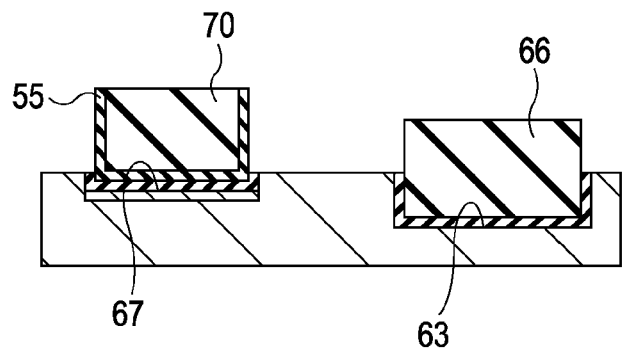

As shown in FIG. 9B, the above-described insulating film 73 (refer to FIG. 8C), the above-described silicon nitride film 72 (refer to FIG. 8C) and the above-described silicon oxide film 71 (refer to FIG. 8C) are removed.

Consequently, the second element isolation region 70 including the above-described insulating film 55 having a negative charge is formed on the second trench 67 disposed in the pixel region 17, and the first element isolation region 66 is formed on the first trench 63 disposed in the peripheral circuit region 18.

Figure 9C:
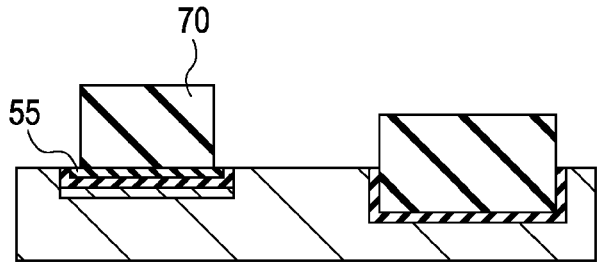

As shown in FIG. 9C, the above-described insulating film 55 having a negative charge (refer to FIG. 9B) formed on the side wall of the second element isolation region 70 in the pixel region 17 may be removed through etching, as necessary. The drawing shows the state after the removal is conducted.

After the above-described first and the second element isolation regions 66 and 70 are formed, although not shown in the drawing, a process for a CMOS image sensor in the related art is conducted. For example, a photoelectric conversion portion (for example, a photodiode), a photoelectric conversion portion isolation region, a pixel transistor, a peripheral circuit portion, a wiring, and the like are formed. For example, in the formation of the above-described pixel transistor, a transfer transistor (reading transistor), a reset transistor, an amplifying transistor, a selection transistor, and the like are formed. In the formation of the above-described peripheral circuit portion, a pixel vertical scanning circuit, a horizontal scanning circuit, a drive circuit, a timing generation circuit, and the like are formed. In the formation of the above-described wiring, for example, an output signal line, a transfer signal line, a reset control line, a selection control line, and a reset voltage supply reset line are formed.

Then, as shown in FIG. 1 described above, the photoelectric conversion portion 15 is isolated by the P-type diffusion layer 22. This P-type diffusion layer 22 is in contact with the element isolation region 14 (corresponding to the first element isolation region 66 in the third example of the manufacturing method) and is electrically continuous with the P-type impurity region 35 (corresponding to the P-type impurity region 57 in the third example of the manufacturing method) disposed under the element isolation region 14. Furthermore, the P-type diffusion layer 22 is connected to the electrode portion 23 to fix the potential. Therefore, the potential of the P-type impurity region 35 is also fixed.

Moreover, the potential of the hole accumulation layer induced under the element isolation region 14 by the insulating film 33 having a negative charge (corresponding to the insulating film 55 having a negative charge in the third example of the manufacturing method) is also fixed through the P-type diffusion layer 22.

In the third example of the above-described method for manufacturing a solid-state imaging device, the insulating film 55 having a negative charge is formed in the second element isolation region 70 disposed in the pixel portion. Therefore, a hole accumulation layer (not shown in the drawing) resulting from the negative charge of the insulating film 55 having a negative charge is induced into the semiconductor substrate 11 immediately under the second element isolation region 70. Noise generation due to defects at the interface between the second element isolation region 70 and the semiconductor substrate 11 is suppressed by this hole accumulation layer.

Furthermore, since the hole accumulation layer is induced by the negative charge, a P-type impurity region is not formed in the semiconductor substrate immediately under the element isolation region, in contrast to that in the related art. Alternatively, in the case where the P-type impurity region 57 is formed, the concentration thereof is reduced.

Consequently, the effect of reducing the channel due to diffusion of the P-type impurity in the P-type impurity region 57 can be suppressed, while the effect becomes significant as the transistor is made finer. In particular, since reduction of the effective channel width of the amplifying transistor is suppressed, the 1/f noise is reduced. Moreover, since the effect of reducing the channel is suppressed, effects are exerted in such a way that an increase in threshold voltage of the transistor is suppressed and variations in threshold voltage are reduced.

Put another way, diffusion of the P-type impurity due to the P-type impurity region 57 is suppressed and the pixel size may be reduced correspondingly, while the effective channel width of the transistor of the pixel transistor portion is ensured and the 1/f noise is reduced.

Consequently, noise suppression and a finer pixel may become mutually compatible.

In addition, the image quality of imaging is improved because of noise reduction. Furthermore, finer pixels can increase the number of pixels. The image quality of imaging thereby becomes at a higher degree of definition. There are advantages as described above.

In the third example of the above-described method for manufacturing a solid-state imaging device, regarding the step shown in FIG. 8A, the second trench 67 is formed in the semiconductor substrate 11. However, the trench may be formed only in the above-described insulating film 73, the silicon nitride film 72, and the silicon oxide film 71 on the above-described semiconductor substrate 11 without being formed in the above-described semiconductor substrate 11. In this case, in the step shown in FIG. 8B, the silicon oxide film 68 is formed on the surface of the above-described semiconductor substrate 11 exposed at the bottom of the second trench 67 disposed in the above-described insulating layer 73, the silicon nitride film 72, and the silicon oxide film 71. The steps thereafter are the same as those in the third example of the above-described manufacturing method.

Fifth Embodiment

Fourth Example of Method for Manufacturing Solid-State Imaging Device

A fourth example of a method for manufacturing a solid-state imaging device, according to a fifth embodiment of the present invention, will be described with reference to sectional views of production steps shown in FIG. 10A to FIG. 11D.

Figure 10A:
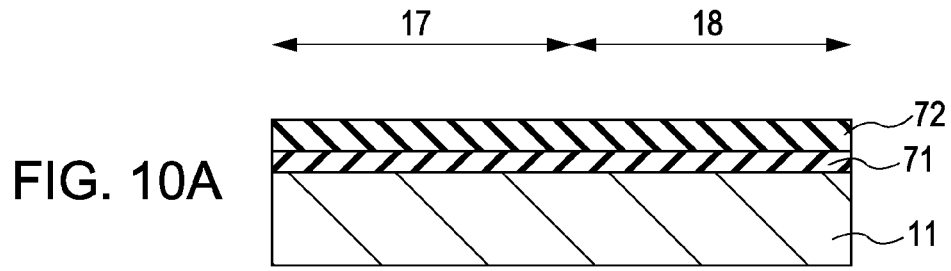
FIGS. 10A to 10E are sectional views showing production steps of a fourth example of a method for manufacturing a solid-state imaging device, according to a fifth embodiment of the present invention.

As shown in FIG. 10A, a silicon oxide film 71 and a silicon nitride film 72 are formed sequentially on a semiconductor substrate 11. For example, a silicon substrate is used for the above-described semiconductor substrate 11.

Figure 10B:
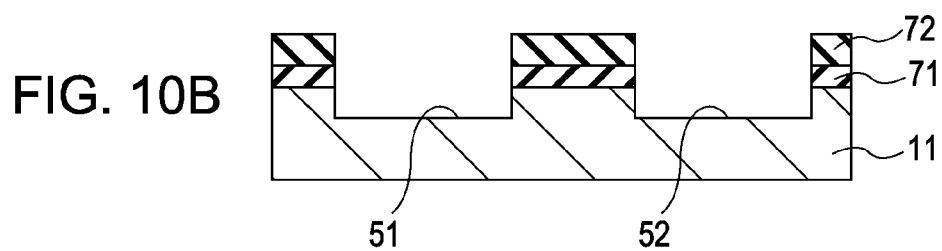

As shown in FIG. 10B, a resist mask (not shown in the drawing) for forming element isolation trenches on the above-described silicon nitride film 72 is formed. The resulting mask is used as an etching mask and the above-described silicon nitride film 72, the above-described silicon oxide film 71, and the above-described semiconductor substrate 11 are etched. That is, a first trench 51 for element isolation is formed in a pixel region 17 of the above-described semiconductor substrate 11 and a second trench 52 for element isolation is formed in a peripheral circuit region 18.

The digging depths of the semiconductor substrate 11 for the above-described first trench 51 and the second trench 52 are determined on the basis of the film thickness of an insulating film of an element isolation region formed in the pixel portion. The above-described digging depth is specified to be, for example, 150 nm or less, and preferably about 50 nm.

Thereafter, the above-described resist mask is removed.

Figure 10C:
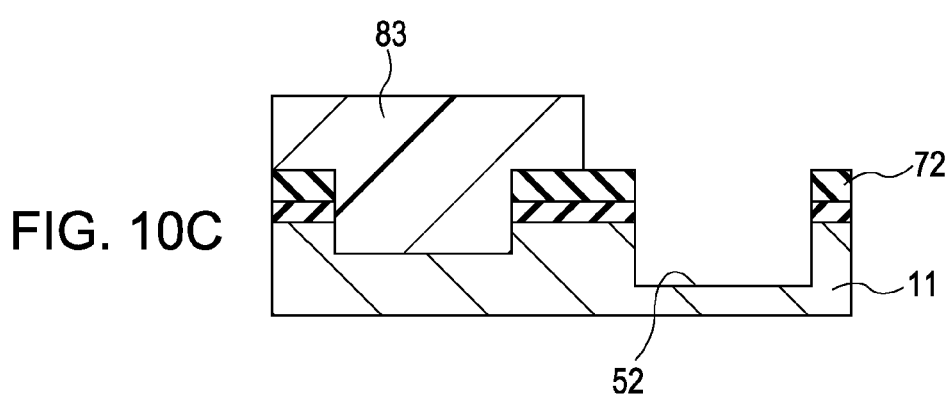

As shown in FIG. 10C, a resist mask 83 covering the pixel region 17 is formed through application of the resist and the lithography. The resulting mask 83 is used as an etching mask, the above-described silicon nitride film 72 is used as a hard mask, and the above-described second trench 52 is further dug into the above-described semiconductor substrate 11.

Thereafter, the above-described resist mask 83 is removed. The drawing shows the state just before the resist mask 83 is removed.

Figure 10D:
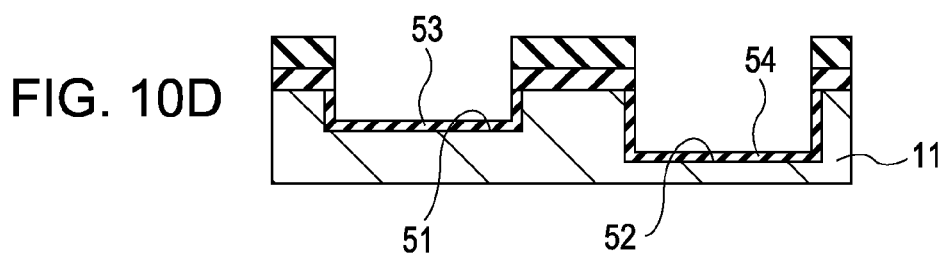

As shown in FIG. 10D, a silicon oxide film 53 is formed on the inner surface of the above-described first trench 51, and a silicon oxide film 54 is formed on the inner surface of the above-described second trench 52. The above-described silicon oxide films 53 and 54 are formed through oxidation of the above-described semiconductor substrate 11 exposed at insides of the above-described first trench 51 and the second trench 52 by, for example, a thermal oxidation method.

Therefore, defects present at the interfaces of the above-described first trench 51 and the second trench 52 to the above-described semiconductor substrate 11 are reduced by the silicon oxide films 53 and 54.

However, as the film thicknesses of the above-described silicon oxide films 53 and 54 increase, an effect of a film, which is buried thereafter and which has a negative charge, on induction of holes into the semiconductor substrate 11 is reduced.

Consequently, it is preferable that the film thicknesses of the above-described silicon oxide films 53 and 54 are 5 nm or less.

Figure 10E:
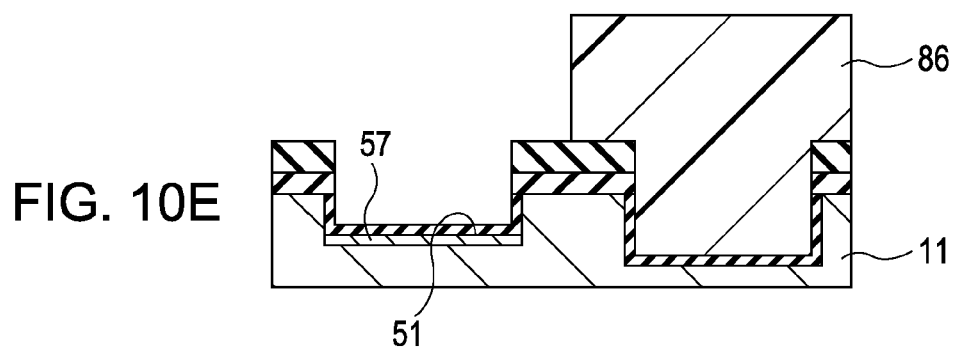

As shown in FIG. 10E, a resist mask 86 covering the peripheral circuit region 18 is formed through application of the resist and the lithography. The resulting resist mask 86 is used as an ion implantation mask and the above-described semiconductor substrate 11 at the bottom of the above-described first trench 51 is doped with a P-type impurity (for example, boron or boron difluoride) so as to form a P-type impurity region 57.

In this regard, in the case where holes can be sufficiently induced into the semiconductor substrate 11 under an element isolation region, which is formed in the above-described first trench 51, by the negative charge of an insulating film, which is formed later and which has a negative charge, it is not necessary to form the above-described P-type impurity region 57.

In the present process, a P-type impurity is implanted in addition to holes induced by the negative charge of the insulating film having a negative charge.

As a matter of course, even when the concentration of the P-type impurity region 57 is reduced, holes are induced by the negative charge of the insulating film having a negative charge and, thereby, the hole concentration substantially equal to that of a process in the related art, wherein the insulating film having a negative charge is not provided, is obtained. As a result, the concentration of the P-type impurity region 57 can be reduced as compared with that in the related art.

Thereafter, the above-described resist mask 86 is removed. The drawing shows the state just before the resist mask 86 is removed.

Figure 11A:
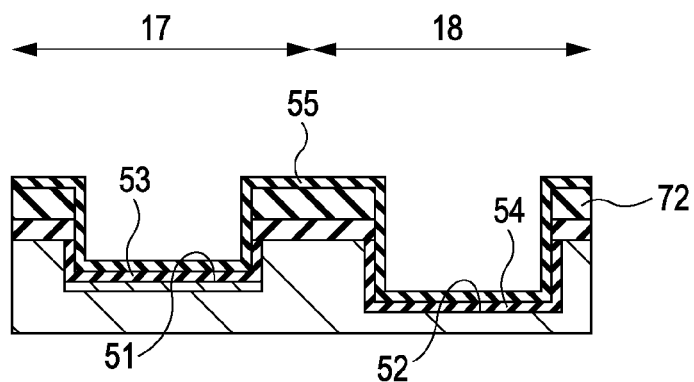
FIGS. 11A to 11D are sectional views showing production steps of the fourth example of the method for manufacturing a solid-state imaging device, according to the fifth embodiment of the present invention.

As shown in FIG. 11A, an insulating film 55 having a negative charge is formed on the inner surfaces of the above-described first trench 51 and the above-described second trench 52 with the above-described silicon oxide films 53 and 54 therebetween. This insulating film 55 having a negative charge is also formed on the above-described silicon nitride film 72.

The above-described insulating film 55 having a negative charge is formed from, for example, a hafnium oxide ($HfO_2$) film, a zirconium oxide ($ZrO_2$) film, an aluminum oxide ($Al_2O_3$) film, a tantalum oxide ($Ta_2O_5$) film, a titanium oxide ($TiO_2$) film, or an yttrium oxide ($Y_2O_3$) film.

Examples of film formation methods include a chemical vapor deposition method, a sputtering method, and an atomic layer deposition (ALD) method. In order to provide a good interface to a substrate, it is favorable to use the atomic layer deposition method.

Furthermore, it is favorable to use the atomic layer deposition method because about 1 nm of silicon oxide ($SiO_2$) layer, which reduces the interface state, can be formed at the same time during film formation. In this case, the step of forming the above-described silicon oxide films 53 and 54 may be omitted.

In the case where the above-described hafnium oxide film is formed by, for example, the atomic layer deposition method, tetrakis ethyl methyl amino hafnium (TEMAHf) and ozone are used as raw material gases. In the case where the above-described zirconium oxide film is formed, tetrakis ethyl methyl amino zirconium (TEMAZr) and ozone are used as raw material gases. In the case where the above-described aluminum oxide film is formed, trimethylamine (TMA) and ozone are used as raw material gases. In the case where the above-described titanium oxide film is formed, titanium tetrachloride ($TiCl_4$) and ozone are used as raw material gases. In the case where the above-described tantalum oxide film is formed, tantalum pentaethoxide (PET: $Ta(OC_2H_5)_5$) and ozone are used as raw material gases.

Examples of the materials other than those described above include lanthanoid oxides, e.g., lanthanum oxide ($La_2O_3$), cerium oxide ($CeO_2$), praseodymium oxide ($Pr_2O_3$), neodymium oxide ($Nd_2O_3$), promethium oxide ($Pm_2O_3$), samarium oxide ($Sm_2O_3$), europium oxide ($Eu_2O_3$), gadolinium oxide ($Gd_2O_3$), terbium oxide ($Tb_2O_3$), dysprosium oxide ($Dy_2O_3$), holmium oxide ($Ho_2O_3$), erbium oxide ($Er_2O_3$), thulium oxide ($Tm_2O_3$), ytterbium oxide ($Yb_2O_3$), and lutetium oxide ($Lu_2O_3$). Moreover, the above-described insulating film 55 having a negative charge may also be formed from a hafnium nitride film, an aluminum nitride film, a hafnium oxynitride film, or an aluminum oxynitride film.

Regarding the above-described insulating film 55 having a negative charge, silicon (Si) or nitrogen (N) may be added to the film within the bounds of not impairing the insulating property. The concentration thereof is determined appropriately within the bounds of not impairing the insulating property of the film. In the case where silicon (Si) or nitrogen (N) is added as described above, it becomes possible to enhance the heat resistance of the film and improve the capability of preventing ion implantation during the process.

Figure 11B:
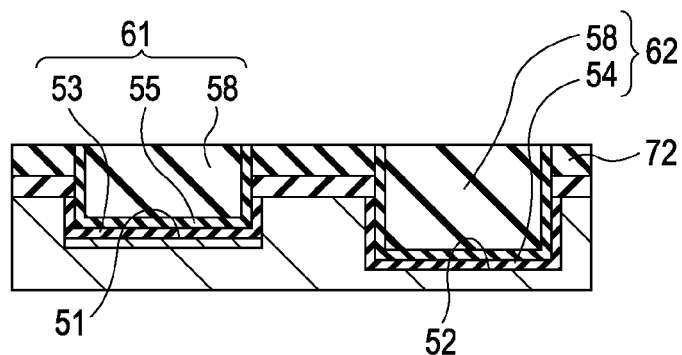

As shown in FIG. 11B, a buried insulating film 58 is formed on the above-described silicon nitride film 72 in such a way that the above-described first trench 51 and the above-described second trench 52 are filled. This buried insulating film 58 is formed from a silicon oxide film by, for example, a chemical vapor deposition (CVD) method.

Thereafter, an excess buried insulating film 58 and the insulating film 55 having a negative charge on the above-described silicon nitride film 72 are removed and flattening is conducted. As for the flattening, for example, a chemical mechanical polishing (CMP) method is used. As a result, a first element isolation region 61 is formed in the inside of the above-described first trench 51 and a second element isolation region 62 is formed in the inside of the second trench 52.

Therefore, the above-described first element isolation region 61 includes the above-described insulating film 55 having a negative charge under the above-described buried insulating film 58 and further includes the silicon oxide film 53. Moreover, the above-described second element isolation region 62 includes the above-described insulating film 55 having a negative charge under the above-described buried insulating film 58 and further includes the silicon oxide film 54.

Figure 11C:
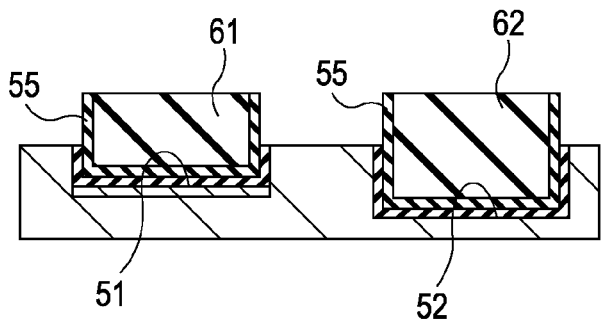

As shown in FIG. 11C, the above-described silicon nitride film 72 (refer to FIG. 11A) and the above-described silicon oxide film 71 (refer to FIG. 10B) are removed.

Consequently, the first element isolation region 61 including the above-described insulating film 55 having a negative charge is formed on the first trench 51 disposed in the pixel region 17, and the second element isolation region 62 is formed on the second trench 52 disposed in the peripheral circuit region 18.

Figure 11D:
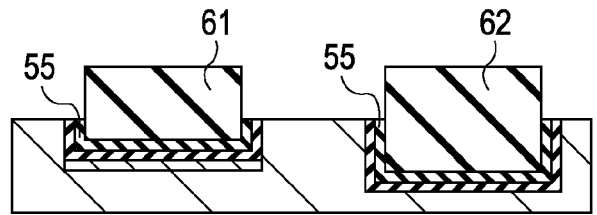

As shown in FIG. 11D, the insulating film 55 having a negative charge (refer to FIG. 11C) formed on the side walls of the above-described first element isolation region 61 and the second element isolation region 62 may be removed through etching, as necessary. The drawing shows the state after the removal is conducted.

After the above-described first and the second element isolation regions 61 and 62 are formed, although not shown in the drawing, a process for a CMOS image sensor in the related art is conducted. For example, a photoelectric conversion portion (for example, a photodiode), a photoelectric conversion portion isolation region, a pixel transistor, a peripheral circuit portion, a wiring, and the like are formed. For example, in the formation of the above-described pixel transistor, a transfer transistor (reading transistor), a reset transistor, an amplifying transistor, a selection transistor, and the like are formed. In the formation of the above-described peripheral circuit portion, a pixel vertical scanning circuit, a horizontal scanning circuit, a drive circuit, a timing generation circuit, and the like are formed. In the formation of the above-described wiring, for example, an output signal line, a transfer signal line, a reset control line, a selection control line, and a reset voltage supply reset line are formed.

Then, as shown in FIG. 1 described above, the photoelectric conversion portion 15 is isolated by the P-type diffusion layer 22. This P-type diffusion layer 22 is in contact with the element isolation region 14 (corresponding to the first element isolation region 61 in the fourth example of the manufacturing method) and is electrically continuous with the P-type impurity region 35 (corresponding to the P-type impurity region 57 in the fourth example of the manufacturing method) disposed under the element isolation region 14. Furthermore, the P-type diffusion layer 22 is connected to the electrode portion 23 to fix the potential. Therefore, the potential of the P-type impurity region 35 is also fixed. Moreover, the potential of the hole accumulation layer induced under the element isolation region 14 by the insulating film 33 having a negative charge (corresponding to the insulating film 55 having a negative charge in the fourth example of the manufacturing method) is also fixed through the P-type diffusion layer 22.

In the fourth example of the above-described method for manufacturing a solid-state imaging device, the insulating film 55 having a negative charge is formed in the first element isolation region 61 disposed in the pixel portion. Therefore, a hole accumulation layer (not shown in the drawing) resulting from the negative charge of the insulating film 55 having a negative charge is induced into the semiconductor substrate 11 immediately under the first element isolation region 61. Noise generation due to defects at the interface between the first element isolation region 61 and the semiconductor substrate 11 is suppressed by this hole accumulation layer.

Furthermore, since the hole accumulation layer is induced by the negative charge, a P-type impurity region is not formed in the semiconductor substrate immediately under the element isolation region, in contrast to that in the related art. Alternatively, in the case where the P-type impurity region 57 is formed, the concentration thereof is reduced.

Consequently, the effect of reducing the channel due to diffusion of the P-type impurity in the P-type impurity region 57 can be suppressed, while the effect becomes significant as the transistor is made finer. In particular, since reduction of the effective channel width of the amplifying transistor is suppressed, the 1/f noise is reduced. Moreover, since the effect of reducing the channel is suppressed, effects are exerted in such a way that an increase in threshold voltage of the transistor is suppressed and variations in threshold voltage are reduced.

Put another way, diffusion of the P-type impurity due to the P-type impurity region 57 is suppressed and the pixel size may be reduced correspondingly, while the effective channel width of the transistor of the pixel transistor portion is ensured and the 1/f noise is reduced.

Consequently, noise suppression and a finer pixel may become mutually compatible.

In addition, the image quality of imaging is improved because of noise reduction. Furthermore, finer pixels can increase the number of pixels. The image quality of imaging thereby becomes at a higher degree of definition. There are advantages as described above.

In the fourth example of the above-described method for manufacturing a solid-state imaging device, regarding the step shown in FIG. 10B, the first trench 51 and the second trench 52 are formed in the semiconductor substrate 11. However, the trenches may be formed only in the above-described silicon nitride film 72 and the silicon oxide film 71 on the above-described semiconductor substrate 11 without being formed in the above-described semiconductor substrate 11. In this case, the second trench 52 is dug into the semiconductor substrate 11 in the step shown in FIG. 10C. Subsequently, in the step shown in FIG. 10D, the silicon oxide film 53 and the silicon oxide film 54 are formed on the surfaces of the above-described semiconductor substrate 11 exposed at the bottom of the first trench 51 and the inner surface of the second trench 52 disposed in the above-described silicon nitride film 72 and the silicon oxide film 71. The steps thereafter are the same as those in the fourth example of the above-described manufacturing method.

Sixth Embodiment

One Example of Configuration of Imaging Apparatus

One example of the configuration of an imaging apparatus according to a sixth embodiment of the present invention will be described with reference to a block diagram shown in FIG. 12. Examples of the imaging apparatuses include video cameras, digital steel cameras, and cellular phone cameras.

Figure 12:
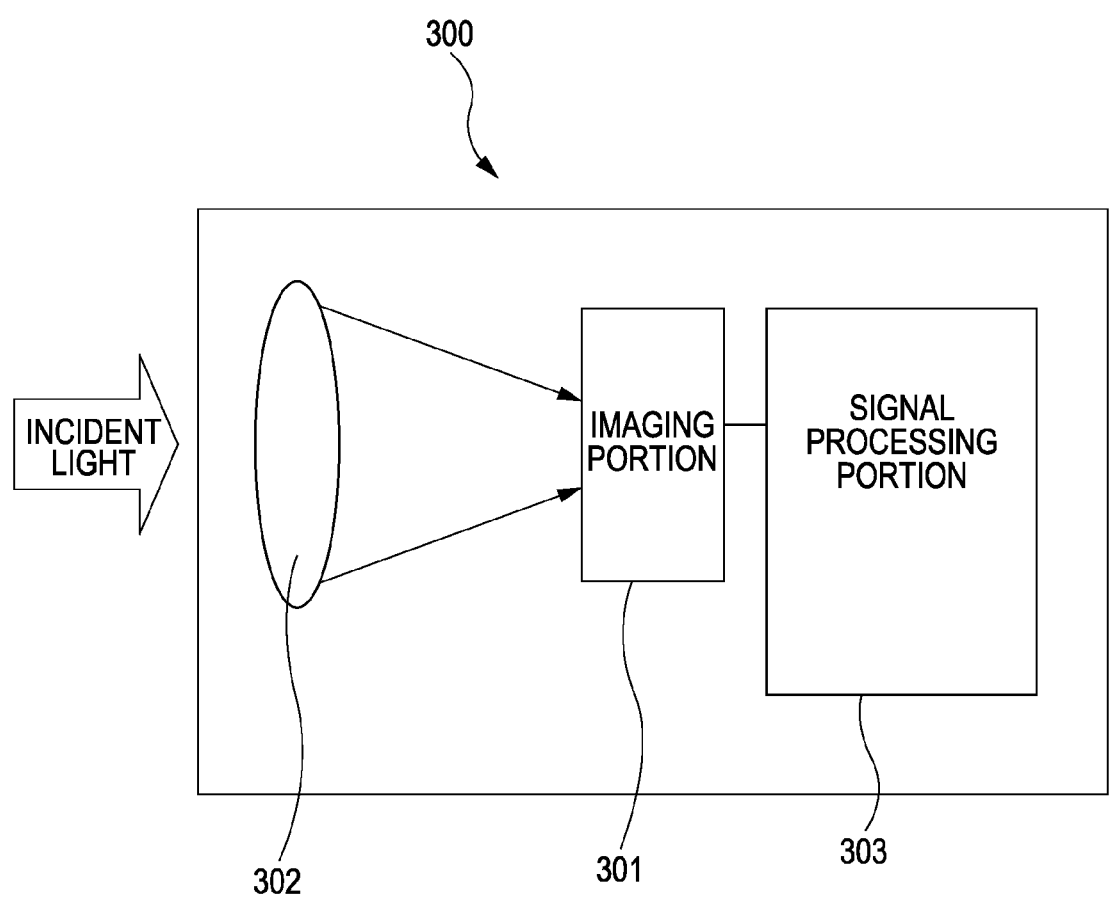
FIG. 12 is a block diagram showing an example of an imaging apparatus according to a sixth embodiment of the present invention.
Figure 13:
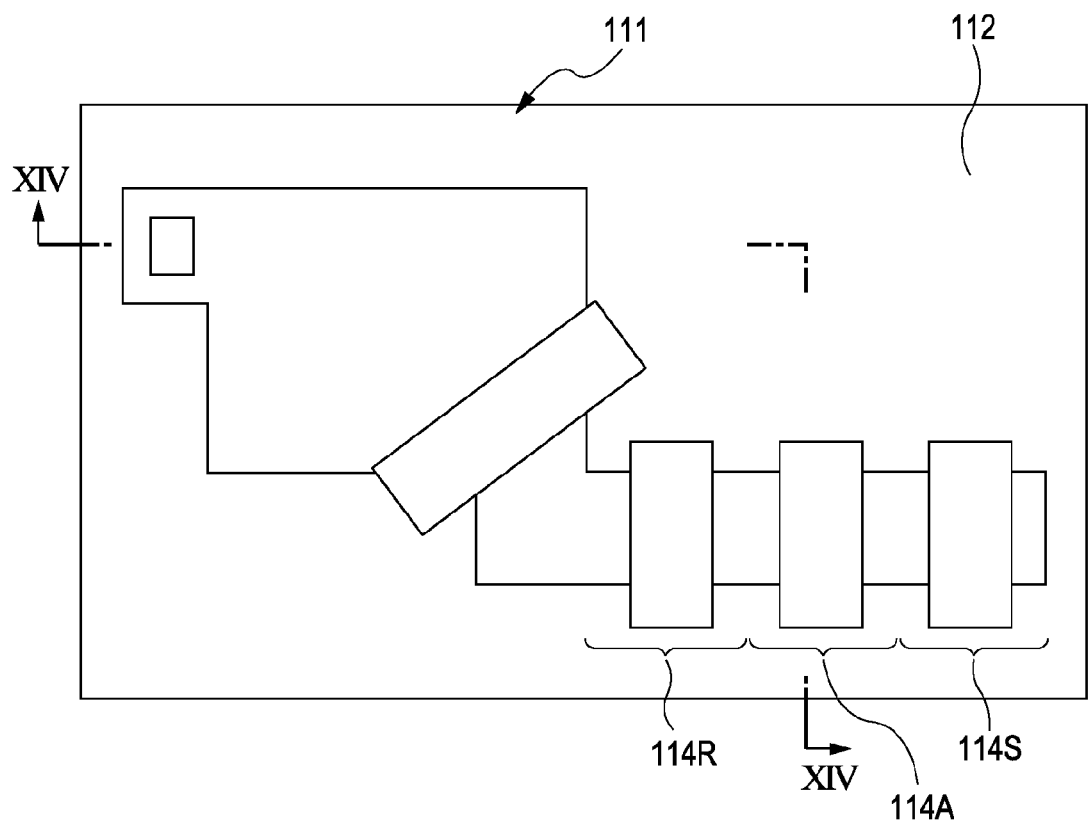
FIG. 13 is a schematic configuration sectional view of an example of a solid-state imaging device in the related art.
Figure 14:
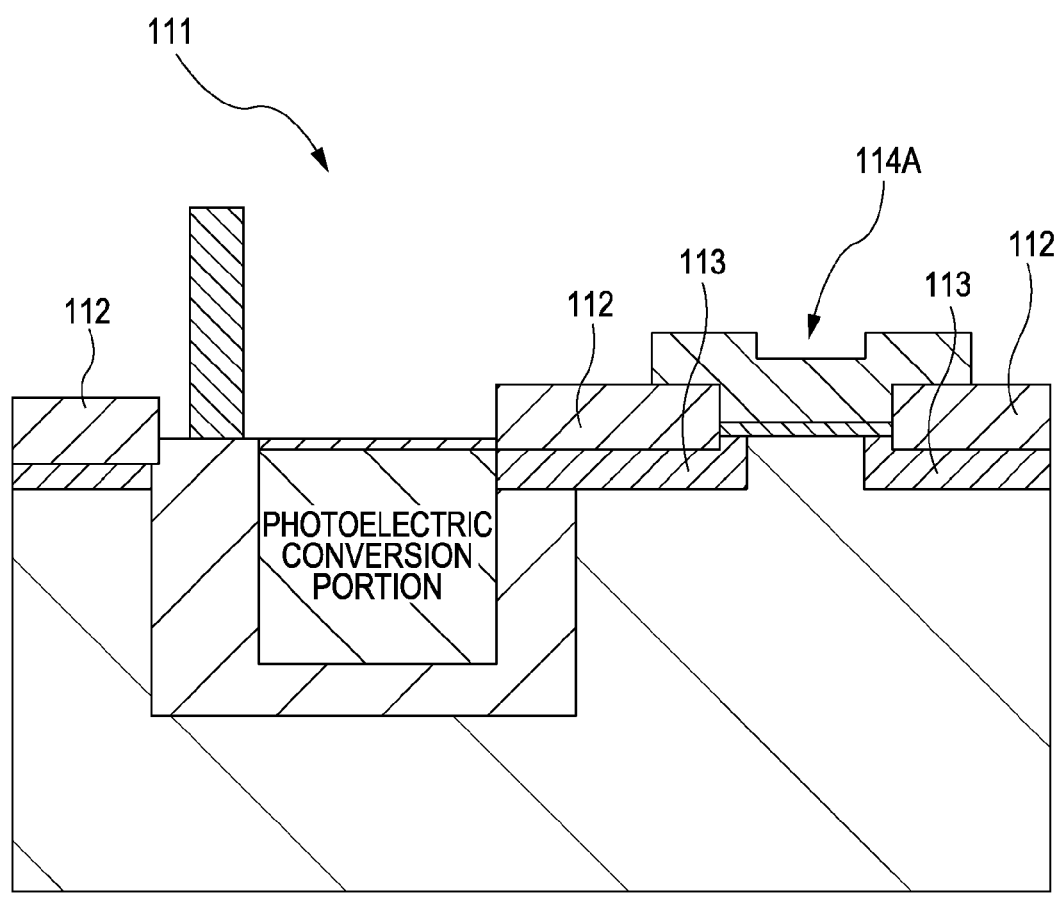
FIG. 14 is a plane layout diagram showing an example of a solid-state imaging device in the related art.

As shown in FIG. 12, an imaging apparatus 300 includes a solid-state imaging device (not shown in the drawing) in an imaging portion 301. An image-focusing optical portion 302 to form an image is provided on the light-condensing side of the imaging portion 301. Furthermore, the imaging portion 301 is connected to a drive circuit to drive it and a signal processing portion 303 including, for example, a signal processing circuit to process a signal, which is photoelectrically converted with the solid-state imaging device, to an image. Moreover, an image signal processed with the above-described signal processing portion may be stored in an image storage portion (not shown in the drawing). In the above-described imaging apparatus 300, the solid-state imaging device 1 according to an embodiment of the present invention may be used for the above-described solid-state imaging device.

Since the solid-state imaging device 1 according to an embodiment of the present invention is used for the imaging apparatus 300, there is an advantage that a high-quality, high-definition image with a low level of noise generation can be obtained.

Incidentally, the above-described imaging apparatus 300 is not limited to the above-described configuration, but can be applied to an imaging apparatus having any configuration including the solid-state imaging device.

The above-described solid-state imaging device 1 may be in the form of one chip or in the form of a module in which an imaging portion and a signal processing portion or an optical system are integrally packaged and which has an imaging function.

In this regard, "imaging" includes not only picking up of image in usual photo shooting with a camera, but also fingerprint detection and the like in a broad sense.

The present application contains subject matter related to that disclosed in Japanese Priority Patent Application JP 2008-297719 filed in the Japan Patent Office on Nov. 21, 2008, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state imaging device comprising, on a semiconductor substrate, a pixel portion having a plurality of pixels each provided with:
    a photoelectric conversion portion, which photoelectrically converts incident light to generate a signal charge;
    a pixel transistor portion, which converts the signal charge read from the photoelectric conversion portion to a voltage;
    an element isolation region portion in the pixel portion, the element isolation region portion having a buried insulating film and an insulating film buried in a trench in the semiconductor substrate, the insulating film having a negative charge and being disposed within a width of the trench so as not to extend beyond the width of the trench, and the buried insulating film having a height that extends above the substrate; and
    a hole accumulation layer in the semiconductor substrate beneath the element isolation region portion, the hole accumulation layer induced by the presence of the insulating film.

2. The solid-state imaging device according to claim 1, comprising an element isolation region comprised of the element isolation region portions, wherein the element isolation region isolates at least the pixels from each other.

3. The solid-state imaging device according to claim 1, wherein the insulating film having a negative charge is an insulating film containing at least one element selected from the group consisting of hafnium, zirconium, aluminum, tantalum, titanium, yttrium, and lanthanoid elements.

4. The solid-state imaging device according to claim 1, wherein a P-type impurity region is disposed in the semiconductor substrate under the element isolation region.

5. The solid-state imaging device according to claim 4, wherein the potential of the P-type impurity region is fixed.

6. The solid-state imaging device according to claim 5, wherein the potential of the P-type impurity region is fixed at a concentration lower then a second potential of a P-type impurity region disposed under an additional element isolation region portion in the pixel portion, the additional element isolation region portion not containing the insulating film.

7. The solid-state imaging device according to claim 1, wherein the trench is between the photoelectric conversion portion and the pixel transistor portion.

8. The solid-state imaging device according to claim 7, wherein the potential of the P-type impurity region is fixed at a concentration lower then a second potential of a P-type impurity region disposed under an element isolation region not containing the insulating film.

9. A method for manufacturing a solid-state imaging device comprising sequentially the steps of:
    forming a first trench for isolating a photoelectric conversion portion and a pixel portion, wherein the first trench and the pixel portion are each located within a pixel region of a semiconductor substrate;
    forming a second trench for element isolation in a peripheral circuit region;
    forming an insulating film having a negative charge on inner surfaces of the first trench and the second trench with silicon oxide films therebetween;
    removing the insulating film which is disposed in the peripheral circuit region and which has a negative charge;
    making the second trench deeper than the first trench; and
    burying buried insulating films into the first trench and the second trench so as to form a first element isolation region in the first trench and a second element isolation region in the second trench, wherein the buried insulating films are disposed within a first width of the first trench so as not to extend beyond the first width of the first trench and within a second width of the second trench so as not to extend beyond the second width of the second trench, and wherein the buried insulating films have a height that extends above the substrate,
    wherein a hole accumulation layer induced by the insulating film is generated in the semiconductor substrate immediately beneath the first trench, and
    wherein the photoelectric conversion portion and the pixel portion are within an individual pixel.

10. The method for manufacturing a solid-state imaging device according to claim 9, wherein
    a P-type impurity region is formed in the semiconductor substrate at the bottom of the first trench
    after the removing an insulating film having a negative charge and before the burying buried insulating films into the first trench and the second trench.

11. The method according to claim 10, wherein a potential of the P-type impurity region is fixed at a concentration lower then a second potential of a P-type impurity region disposed under an additional element isolation region in the pixel region, the additional element isolation region not containing the insulating film.

12. The method according to claim 9, wherein the pixel portion is a pixel transistor portion and the first trench is between the photoelectric conversion portion and the pixel transistor portion.

13. The method according to claim 12, wherein a potential of the P-type impurity region is fixed at a concentration lower then a second potential of a P-type impurity region disposed under an element isolation region not containing the insulating film.

14. A method for manufacturing a solid-state imaging device comprising sequentially the steps of:
   forming a first trench for isolating a photoelectric conversion portion in a pixel region of a semiconductor substrate and a second trench for element isolation in a peripheral circuit region;
   making the second trench deeper than the first trench while the first trench is masked;
   forming an insulating film having a negative charge on inner surfaces of the first trench and the second trench with silicon oxide films therebetween;
   removing the insulating film which is disposed in the peripheral circuit region and which has a negative charge; and
   burying buried insulating films into the first trench and the second trench so as to form a first element isolation region in the first trench and a second element isolation region in the second trench, wherein the buried insulating films are disposed within a first width of the first trench so as not to extend beyond the first width of the first trench and within a second width of the second trench so as not to extend beyond the second width of the second trench, and wherein the buried insulating films have a height that extends above the substrate, and
   wherein,
   a hole accumulation layer induced by the insulating film is generated in the semiconductor substrate immediately beneath the first trench.

15. The method for manufacturing a solid-state imaging device according to claim 14, wherein
   a P-type impurity region is formed in the semiconductor substrate at the bottom of the first trench
   after the removing an insulating film having a negative charge and before the burying buried insulating films into the first trench and the second trench.

16. A method for manufacturing a solid-state imaging device comprising sequentially the steps of:
   forming a first trench isolating a photoelectric conversion portion in a peripheral circuit region of a substrate including a semiconductor substrate, wherein the first trench is in contact with the photoelectric conversion portion;
   burying a first buried insulating film into the first trench so as to form a first element isolation region;
   forming an insulating film covering the first element isolation region on the substrate;
   forming a second trench for element isolation in a pixel region of the semiconductor substrate provided with the insulating film;
   forming an insulating film having a negative charge on an inner surface of the second trench with a silicon oxide film therebetween; and
   burying a second buried insulating film into the second trench so as to form a second element isolation region, wherein the buried insulating films are disposed within a width of the second trench so as not to extend beyond the width of the second trench, and wherein the buried insulating films have a height that extends above the substrate, and
   wherein,
   a hole accumulation layer induced by the insulating film is generated in the semiconductor substrate immediately beneath the second trench.

17. The method for manufacturing a solid-state imaging device according to claim 16, wherein
   a P-type impurity region is formed in the semiconductor substrate at the bottom of the second trench
   after the forming a second trench and before the burying a second buried insulating film into the second trench.

18. A method for manufacturing a solid-state imaging device comprising sequentially the steps of:
   forming a first trench for isolating a photoelectric conversion portion in a pixel region of a semiconductor substrate and a second trench for element isolation in a peripheral circuit region, wherein the first trench is in contact with the photoelectric conversion portion;
   making the second trench deeper than the first trench while the first trench is masked;
   forming an insulating film having a negative charge on inner surfaces of the first trench and the second trench with silicon oxide films therebetween; and
   burying buried insulating films into the first trench and the second trench so as to form a first element isolation region in the first trench and a second element isolation region in the second trench, wherein the buried insulating films are disposed within a first width of the first trench so as not to extend beyond the first width of the first trench and within a second width of the second trench so as not to extend beyond the second width of the second trench, and wherein the buried insulating films have a height that extends above the substrate, and
   wherein,
   a hole accumulation layer induced by the insulating film is generated in the semiconductor substrate immediately beneath the second trench.

19. The method for manufacturing a solid-state imaging device according to claim 18, wherein
   a P-type impurity region is formed in the semiconductor substrate at the bottom of the first trench
   after removal of the insulating film having a negative charge and before the burying buried insulating film.

20. An imaging apparatus comprising:
   an image-focusing optical portion to condense incident light;
   an imaging portion including a solid-state imaging device to receive and photoelectrically convert the light condensed with the image-focusing optical portion; and
   a signal processing portion to process the signal subjected to the photoelectrical conversion,
   wherein,
   the solid-state imaging device includes, on a semiconductor substrate, a pixel portion provided with a photoelectric conversion portion, which photoelectrically converts incident light to obtain a signal charge;
   a pixel transistor portion, which converts the signal charge read from the photoelectric conversion portion to a voltage;
   an element isolation region disposed in the pixel portion for isolating the photoelectric conversion portion and the pixel transistor portion, the element isolation region including a buried insulating film and an insulating film buried in a trench disposed in the semiconductor substrate, wherein the insulating film is disposed within a width of the trench so as not to extend beyond the width of the trench, and wherein the buried insulating film has a height that extends above the substrate; and the element isolation region insulating film having a negative charge; and a hole accumulation layer induced by the insulating film is generated in the semiconductor substrate immediately beneath the element isolation region.

* * * * *